(12) United States Patent
Wang

(10) Patent No.: US 7,317,243 B2
(45) Date of Patent: Jan. 8, 2008

(54) ENCAPSULATED LEAD HAVING STEP CONFIGURATION

(76) Inventor: Chung-Cheng Wang, No.16, Alley 10, Lane 125, Daxing 11th St., Taipei City, Taichung County (TW) 411

( * ) Notice: Subject to any disclaimer, the term of this patent is extended or adjusted under 35 U.S.C. 154(b) by 110 days.

(21) Appl. No.: 10/944,808

(22) Filed: Sep. 21, 2004

(65) Prior Publication Data
US 2005/0104205 A1 May 19, 2005

(30) Foreign Application Priority Data
Oct. 8, 2003 (TW) .............................. 92128017 A

(51) Int. Cl.
*H01L 23/495* (2006.01)
*H01L 21/00* (2006.01)
(52) U.S. Cl. ...................... 257/668; 257/693; 257/701; 438/125
(58) Field of Classification Search ...................... None
See application file for complete search history.

(56) References Cited

U.S. PATENT DOCUMENTS

| | | | | |
|---|---|---|---|---|
| 4,819,041 A * | 4/1989 | Redmond | ................... | 257/687 |
| 5,458,716 A * | 10/1995 | Alfaro et al. | ................ | 156/245 |
| 5,650,915 A * | 7/1997 | Alfaro et al. | ................ | 361/707 |
| 5,684,330 A * | 11/1997 | Lee | .............................. | 257/692 |
| 6,153,928 A * | 11/2000 | Cho | ............................ | 257/686 |
| 6,291,892 B1 * | 9/2001 | Yamaguchi | ................... | 257/778 |
| 6,696,738 B1 * | 2/2004 | Tu et al. | ..................... | 257/433 |
| 6,723,585 B1 * | 4/2004 | Tu et al. | ..................... | 438/123 |
| 6,774,447 B2 * | 8/2004 | Kondo et al. | ............... | 257/432 |
| 6,797,541 B2 * | 9/2004 | Chun et al. | ................. | 438/111 |
| 6,983,537 B2 * | 1/2006 | Park | ............................ | 29/840 |
| 7,154,156 B2 * | 12/2006 | Minamio et al. | ........... | 257/431 |
| 2003/0168720 A1 * | 9/2003 | Kamada | ..................... | 257/666 |
| 2004/0157372 A1 * | 8/2004 | Manatad | ..................... | 438/108 |

\* cited by examiner

*Primary Examiner*—Alonzo Chambliss
(74) *Attorney, Agent, or Firm*—Bacon & Thomas, PLLC

(57) ABSTRACT

Substrate for electrical devices and methods of manufacturing such substrate are disclosed. An embodiment for the substrate comprised of an insulator and a plurality of conductive elements, wherein the insulator having a recess. The conductive elements embedded in the insulator. The conductive elements extend from the insulator surface to the recess. There are two portions of the conductive elements for electrical connection respectively, wherein a portion of conductive element may protrude the insulator surface for electrical connection. In this manner, solder balls are not needed. Moreover, the substrate of the present invention may also comprise an adhesive mean, which is between the conductive elements and the insulator. In addition, the substrate may further comprise a submember such as a chip, heat spreader etc., and the present invention may be capable of affording a thinner electrical device thickness, enhanced reliability, and a decreased cost in production.

16 Claims, 29 Drawing Sheets

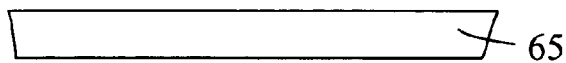
Fig. 1 A
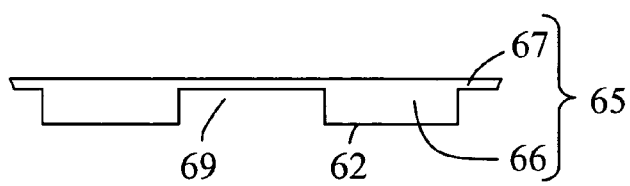
Fig. 1 B
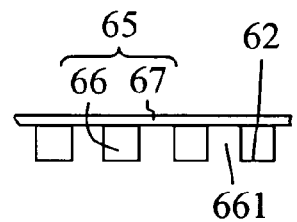
Fig. 1 B a
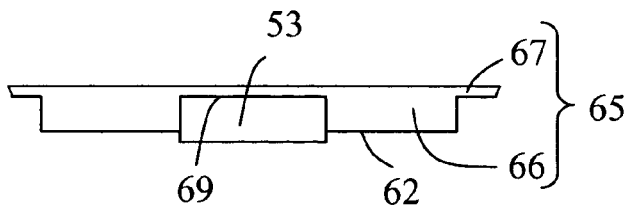
Fig. 1 C
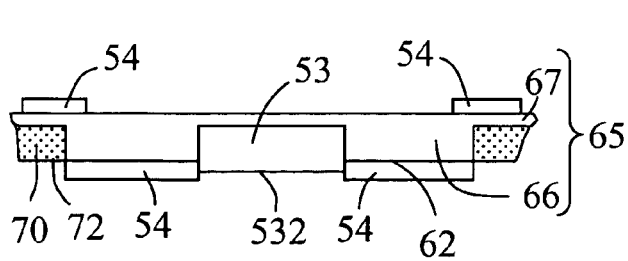
Fig. 1 D
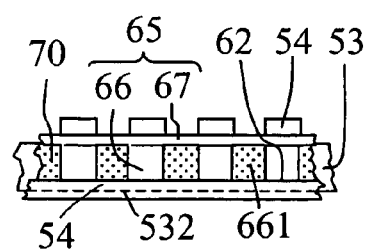
Fig. 1 D a

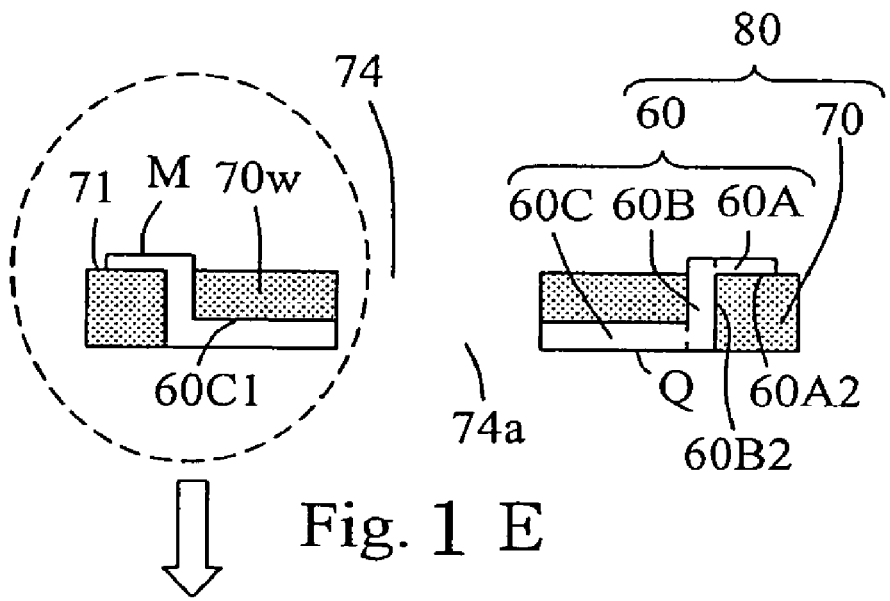
Fig. 1 E
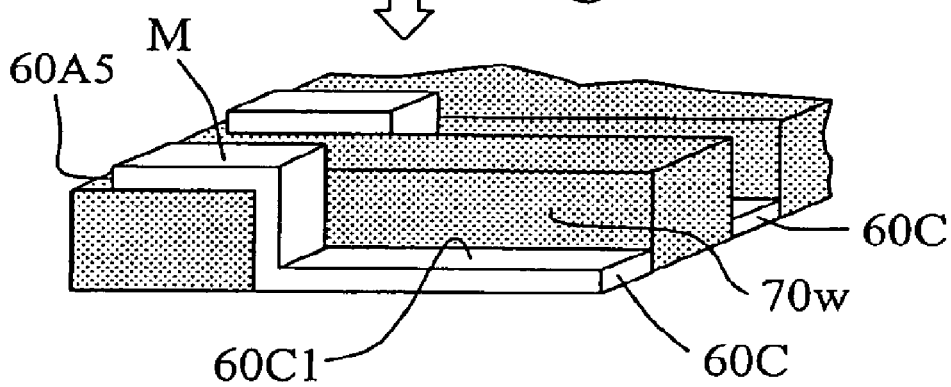
Fig. 1 E a
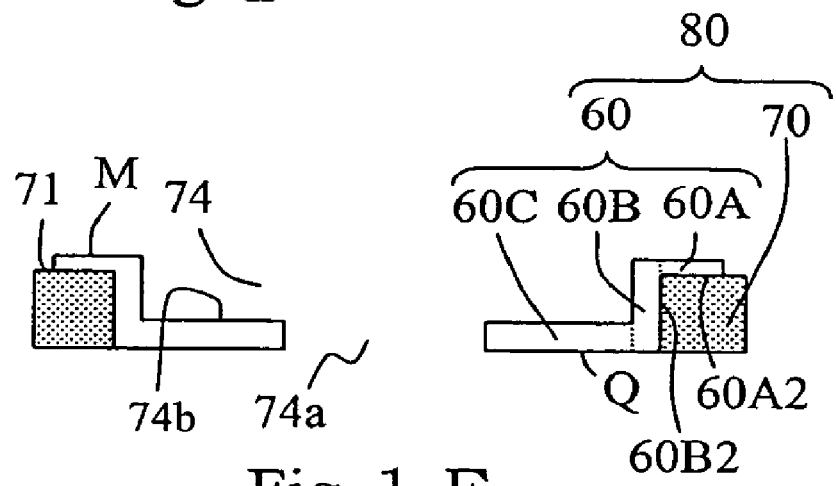
Fig. 1 F

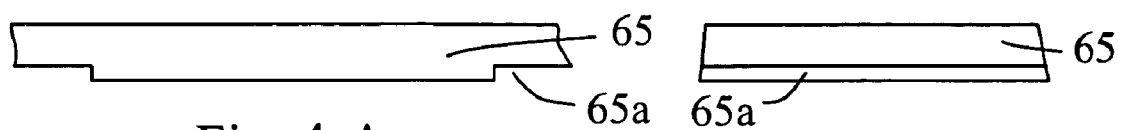
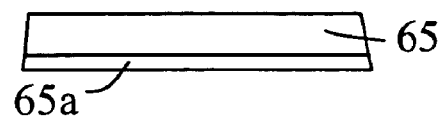
Fig. 4 A          Fig. 4 A a
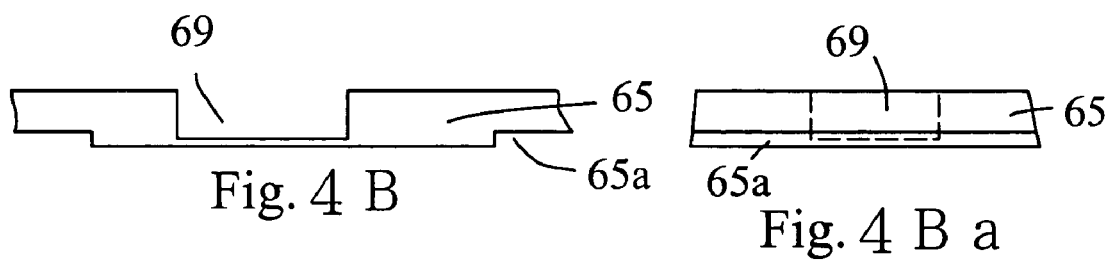
Fig. 4 B          Fig. 4 B a
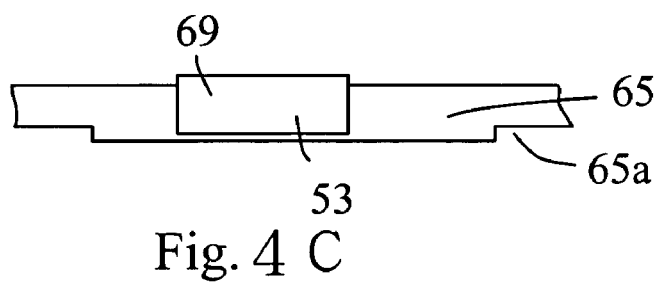
Fig. 4 C
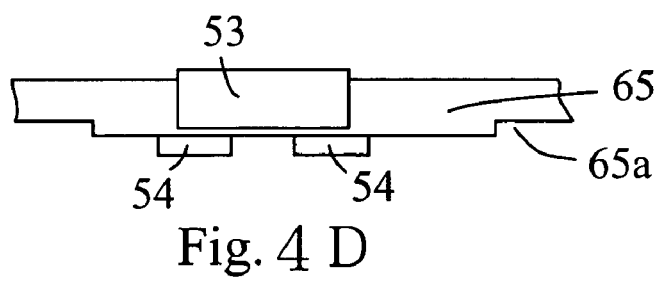
Fig. 4 D

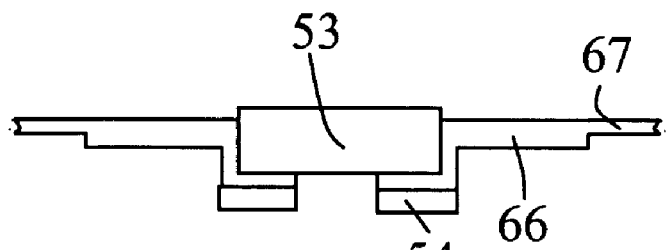
Fig. 4 E
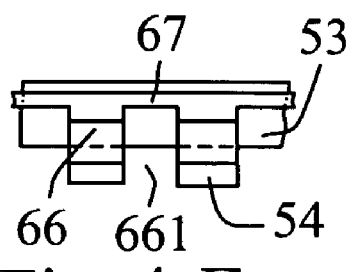
Fig. 4 E a
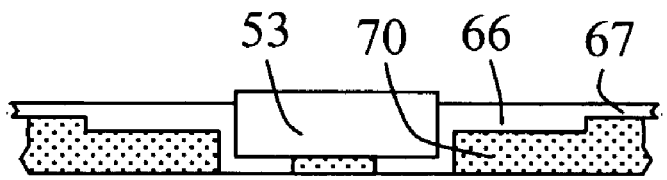
Fig. 4 F
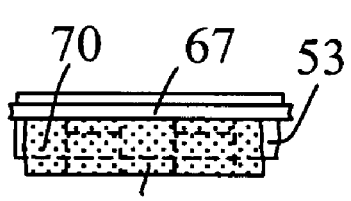
Fig. 4 F a
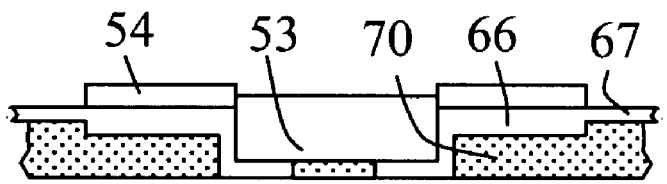
Fig. 4 G
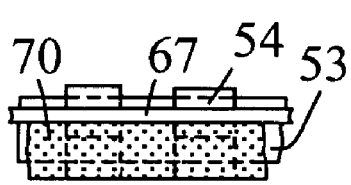
Fig. 4 G a
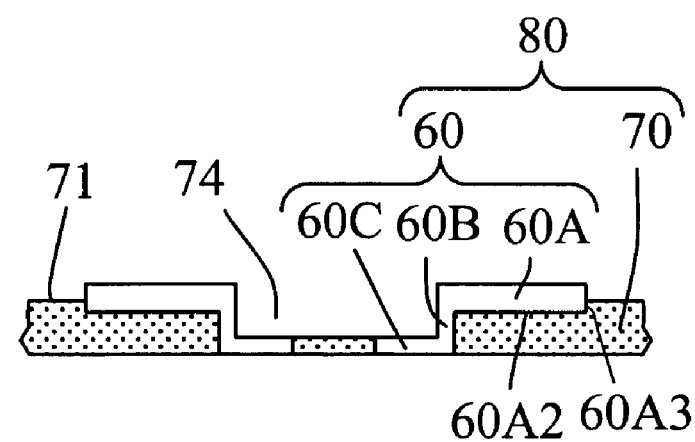
Fig. 4 H
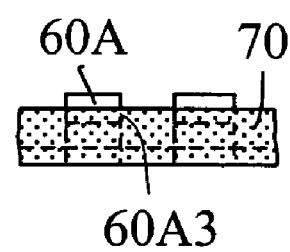
Fig. 4 H a

Fig. 8 B a

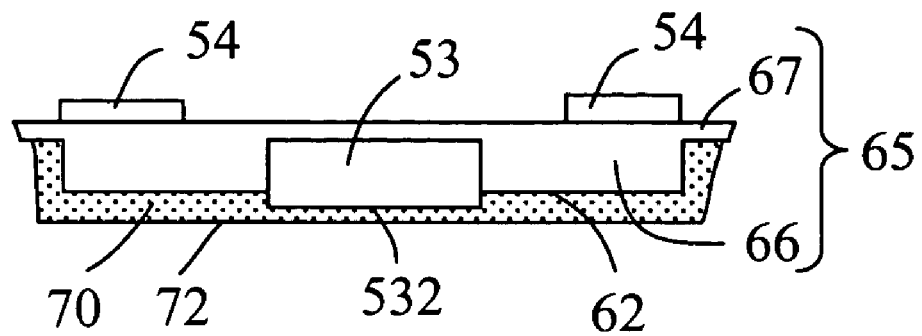
Fig. 8 D
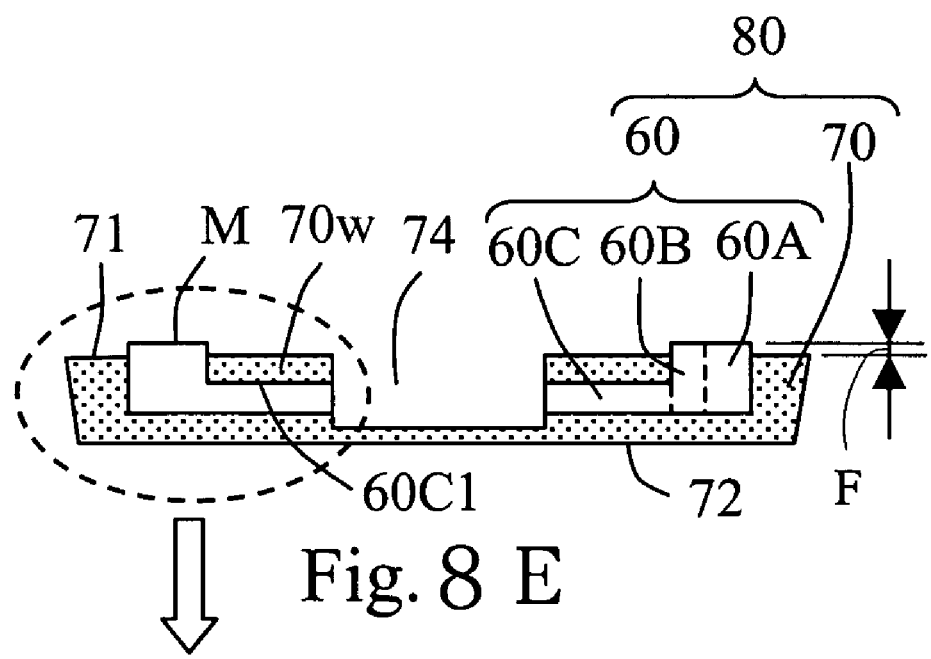
Fig. 8 E
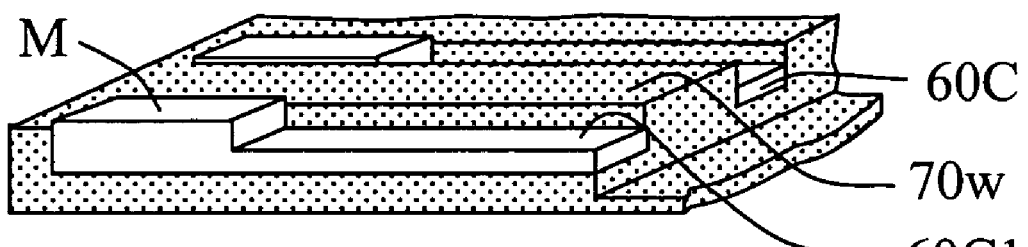
Fig. 8 E a

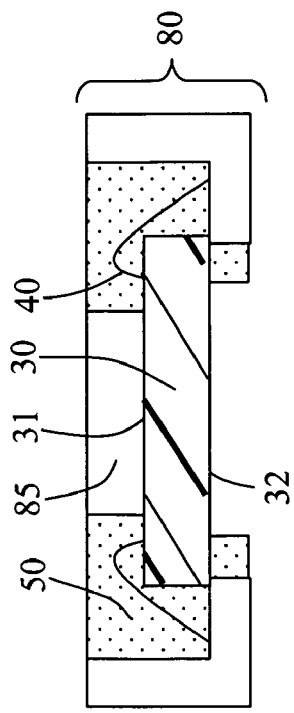
Fig. 13
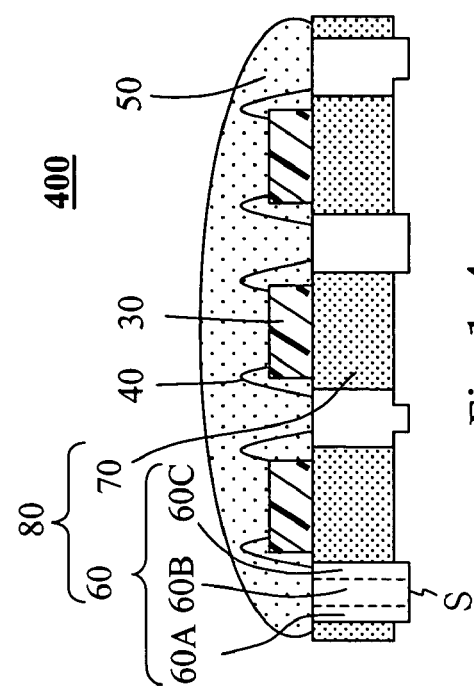
Fig. 14
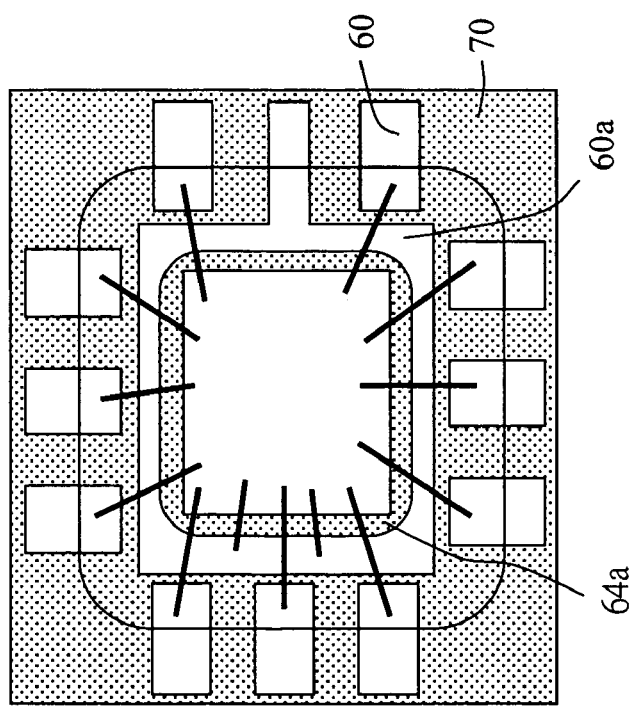
Fig. 12A
Fig. 12B

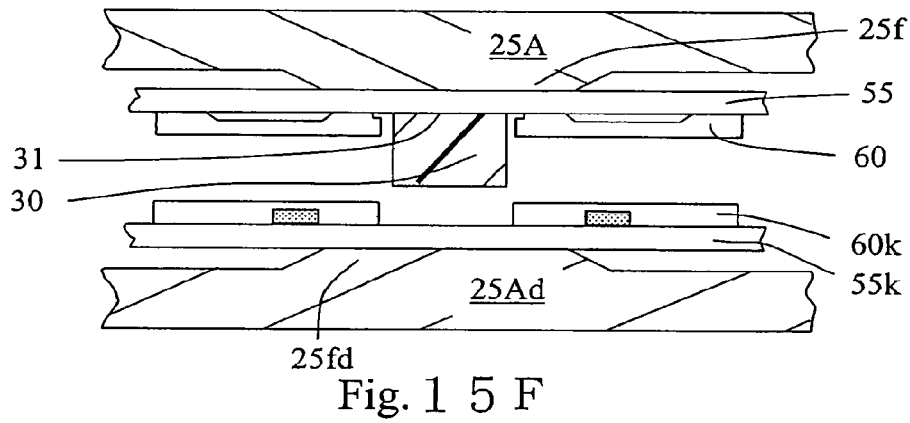
Fig. 15F
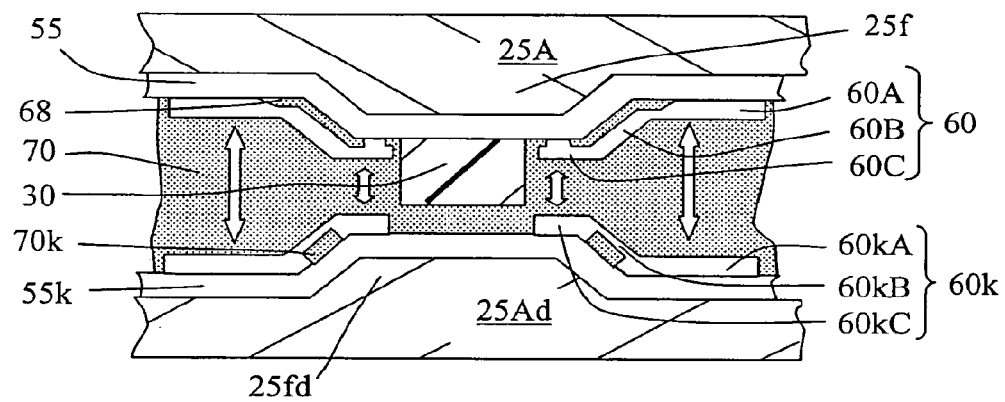
Fig. 15G
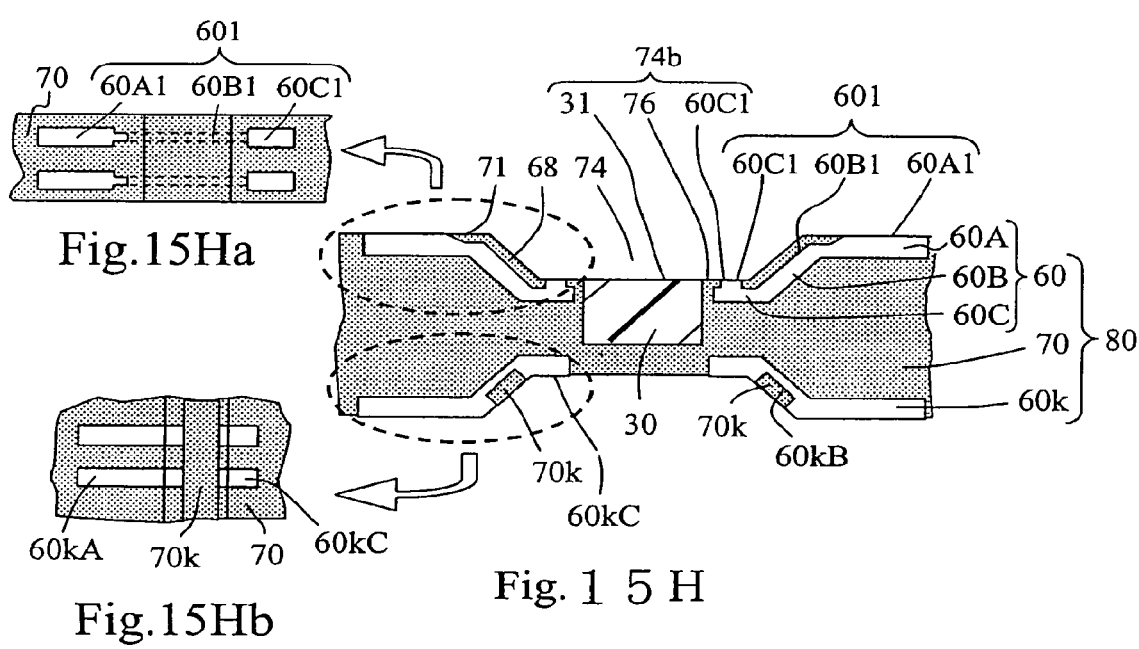
Fig.15Ha
Fig.15Hb
Fig. 15H

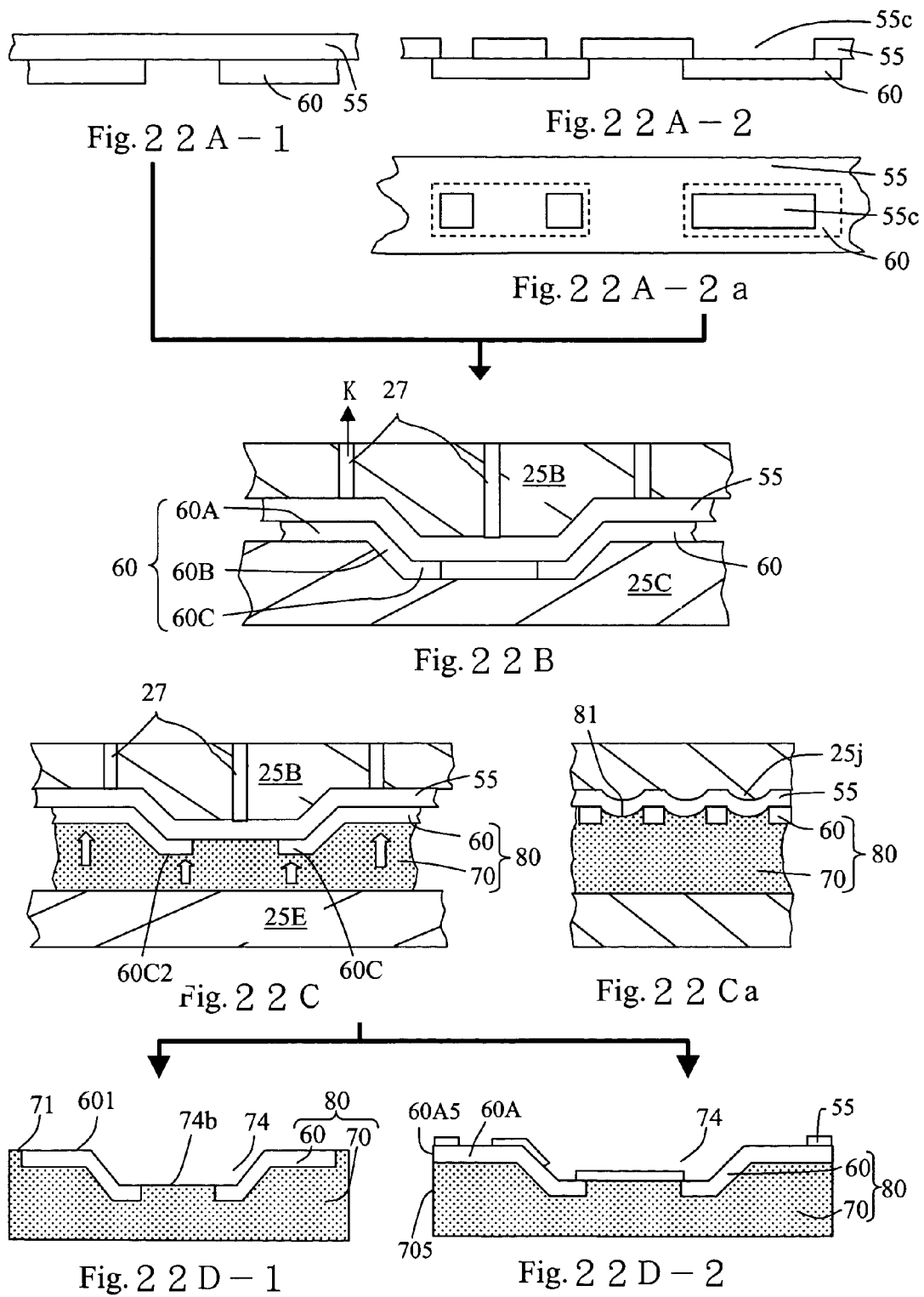

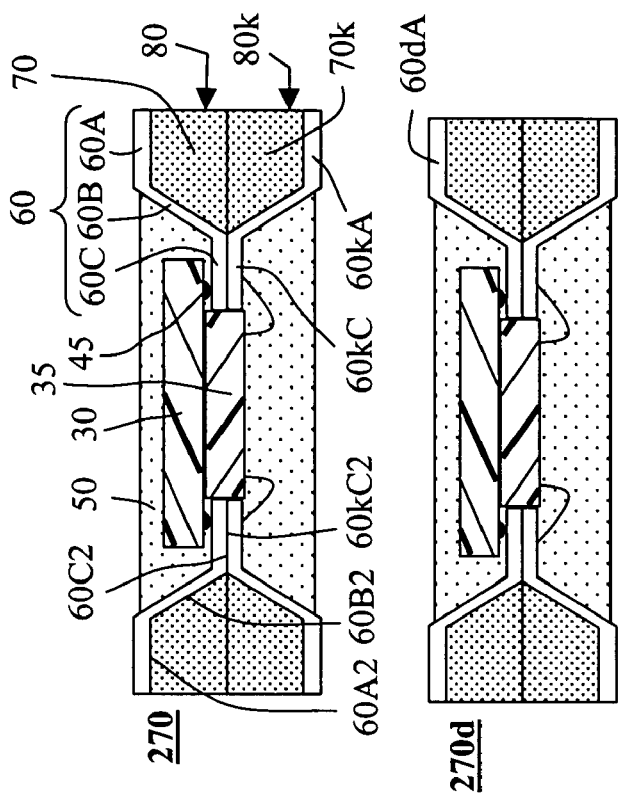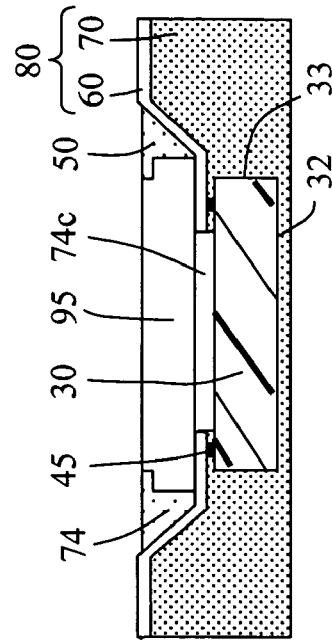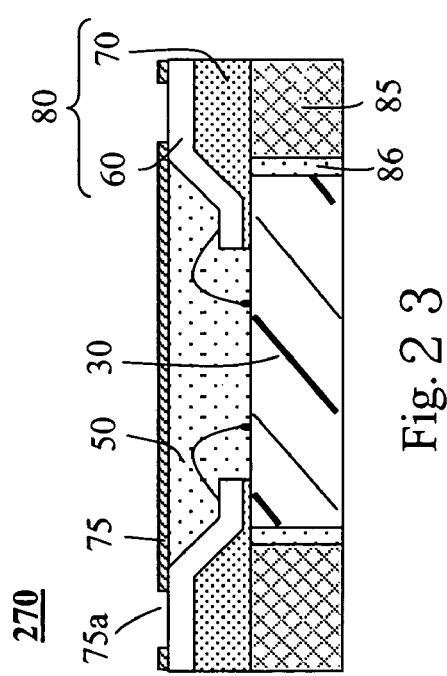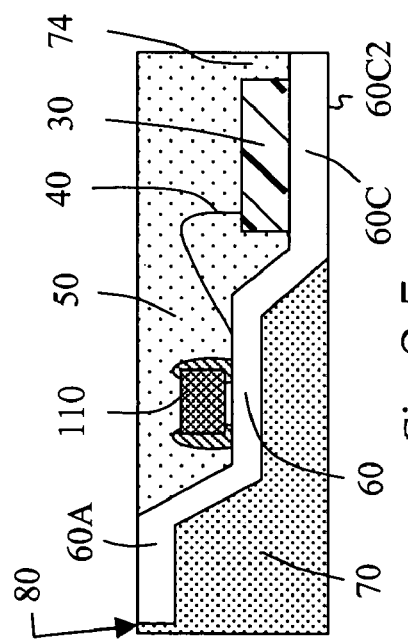

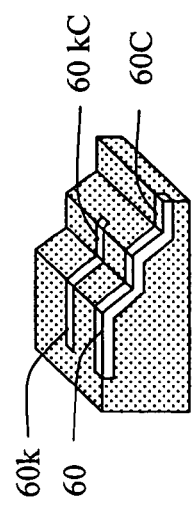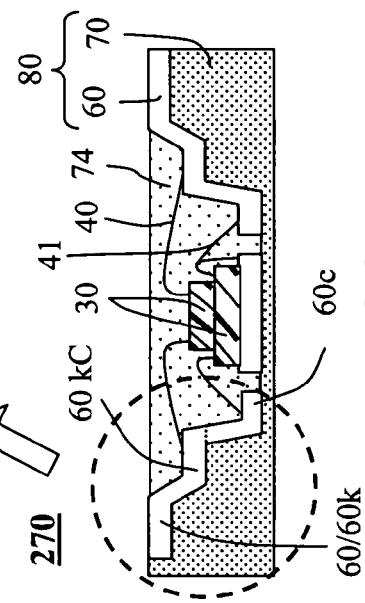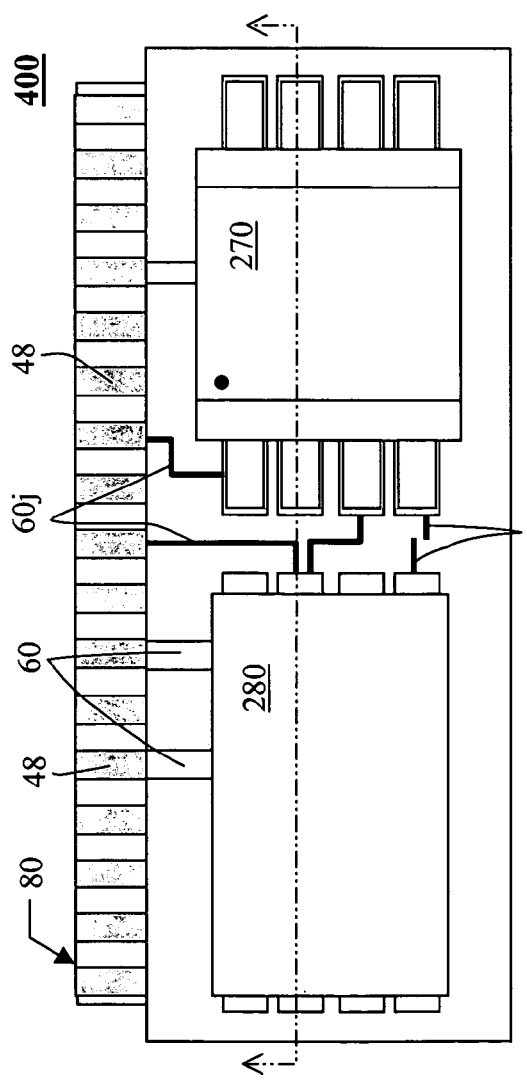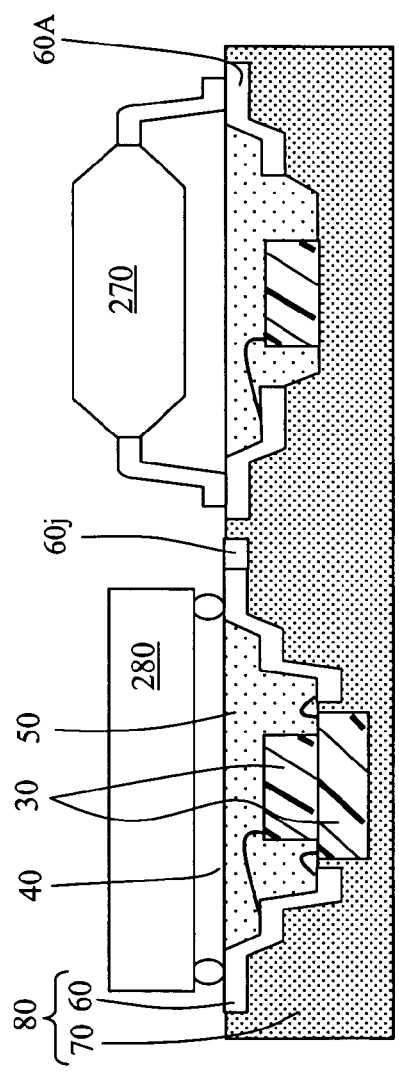
Fig. 28 A
Fig. 28 B
Fig. 27 A
Fig. 27 B

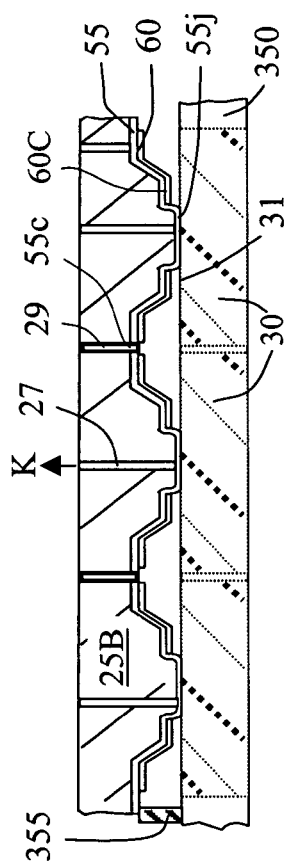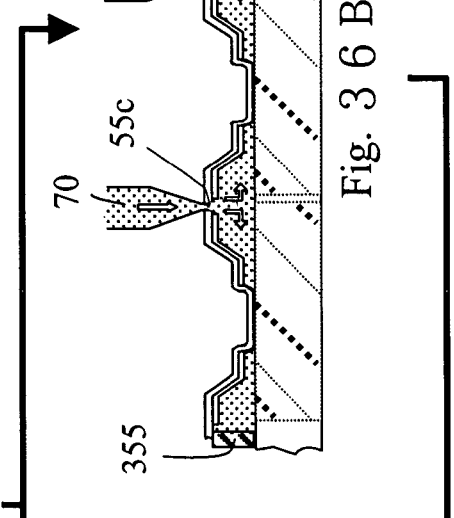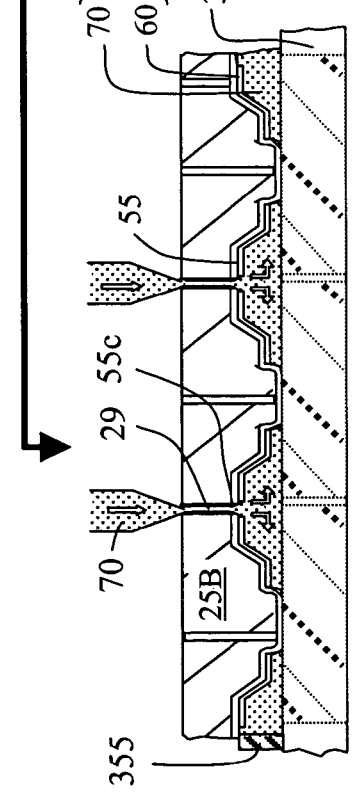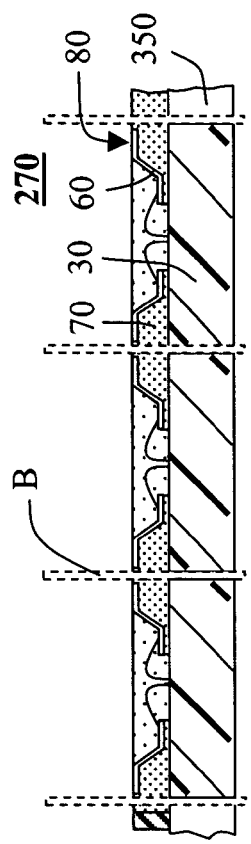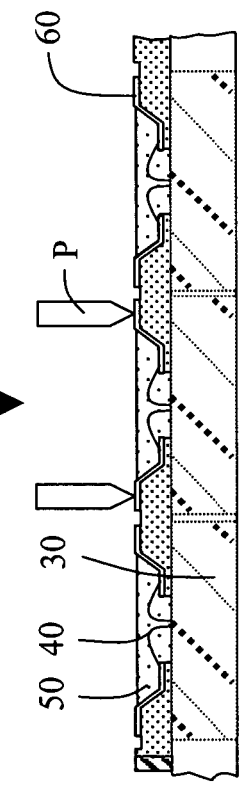

ENCAPSULATED LEAD HAVING STEP CONFIGURATION

BACKGROUND OF THE INVENTION

1. Field of the Invention

The present invention relates to a substrate for electrical device and methods of manufacturing the same, more particularly, it relates to a substrate for electrical device, which enhancing reliability of electrical devices and downsizing electrical devices.

2. Description of the Related Art

Users of electrical devices are continually demanding better quality of electrical devices, smaller(thinner) electrical devices and inexpensive electrical devices, wherein the better quality of electrical devices includes higher reliability and enhanced heat dissipation of electrical devices. So manufacturers of electrical device research and develop electrical devices for achieving the demands mentioned-above.

At first, referring to FIG. 51 shows a conventional electrical device 100 comprising: a substrate 2 having a through hole 6, a plurality of conductive fingers 3 and a plurality of solder balls 4 thereon, wherein the solder balls 4 electrically connected the substrate 2 to the printed circuit board 7; a chip 5 placed in the through hole 6 of substrate 2; a plurality of conductive wires 8 electrically connected the chip 5 to the conductive fingers 3 respectively; an encapsulant 9 encapsulates the chip 5, substrate 2 and the conductive wires 8, wherein the height "H" of the solder ball 4 is higher than the height "n" of the encapsulant 9 (i.e. the higher the encapsulant 9 is, the bigger the solder ball 4 is needed.). In this manner, more material for manufacturing solder ball 4 is needed, then the cost increased, and the thickness of electrical device is thicker. Moreover, due to the solder ball 4 attaching to the conductive finger 3 by the surface 23 of the solder ball 4 exclusively. It is easy to cause peeling-off problems of solder balls 4 by means of contamination which is happened while operating the attaching (solder balls) process, thermal effects and/or other reasons such as collision. When the peeling-off problem happened, the solder ball 4 separated from the conductive finger 3 easily. It may cause the electrical device 100 to be not functional well.

SUMMARY OF THE INVENTION

It is therefore an object of the invention to solve the mentioned-above problems. In accordance with the invention, the substrate includes an insulator and a plurality of conductive elements, wherein the insulator having a recess. The conductive elements having a first portion, a second portion and a third portion respectively, the conductive elements are staircase-shaped, and embedded into the insulator. The conductive elements extend from the insulator surface to the recess of insulator. There are two portions of the conductive elements for electrical connection respectively, wherein a portion of the conductive element may protrude the insulator surface for external connection. In this manner, the solder balls are not needed. Moreover, the substrate of the present invention may further comprise an adhesive mean which is between the conductive elements and the insulator, In addition, the substrate may also comprise a submember which is encapsulated by the insulator. The submember is selectively serving as a heat spreader, chip or transparent plate etc.

The mentioned-above and further objects of the present invention will be more adequately appeared from the detailed description, accompanying drawings and appended claims as follow.

BRIEF DESCRIPTION OF THE DRAWINGS

FIGS. 1A-1F show cross-sectional views of a step of first method for manufacturing a first preferred embodiment of substrate of the present invention, wherein FIG. 1Ba is a side view of FIG. 1B, FIG. 1Da is a side view of FIG. 1D, and FIG. 1Ea is a partially enlarged perspective view of FIG. 1E.

FIGS. 4A-4H show cross-sectional views of a step of second method for manufacturing a first preferred embodiment of substrate of the present invention, wherein FIG. 4Aa is a side view of FIG. 4A. FIG. 4Ba is a side view of FIG. 4B. FIG. 4Ea is a side view of FIG. 4E. FIG. 4Fa is a side view of FIG. 4F. FIG. 4Ga is a side view of FIG. 4G, and FIG. 4Ha is a side view of FIG. 4H.

FIGS. 9-14 are cross-sectional views show embodiments of electrical device according to the present invention, the substrate is manufactured by the third method of first preferred embodiment of substrate, wherein FIG. 12A is a top view of an electrical device according to the present invention, and FIG. 12B is a cross-sectional view of FIG. 12A.

FIGS. 22A-22D show cross-sectional views of a step of third method for manufacturing a second preferred embodiment of substrate of the present invention, wherein FIG. 22A-1 is a cross-sectional view which is one of steps of third method for manufacturing a second preferred embodiment of substrate of the present invention, wherein the adhesive mean 55 is not included any opening 55c; FIG. 22A-2 is a cross-sectional view which is one of steps of third method for manufacturing a second preferred embodiment of substrate of the present invention, wherein the adhesive mean 55 includes a plurality of openings 55c; FIG. 22A-2a is a top view of FIG. 22A-2: FIG. 22Ca is a side view of FIG. 22C: FIG. 22D-1 is a cross-sectional view of the second preferred embodiment of substrate according to the present invention, wherein the adhesive mean 55 has been removed, and FIG. 22D-2 is a cross-sectional view of the second preferred embodiment of substrate according to the present invention shown the adhesive mean 55 has not been removed.

FIGS. 23-26 are cross-sectional views show embodiments of electrical device according to the present invention, the substrate is manufactured by the third method of second preferred embodiment of substrate, wherein FIG. 24 is a cross-sectional view of electrical device according to the present invention showing an electrical device 270 is stacked on another electrical device 270d through the first portion 60kA of conductive element involved in the electrical device 270 and the first portion 60dA of conductive element involved in the another electrical device 270d (see page 22, lines 20-21: the other stacked structures of electrical device, please refer to FIGS. 3, 9, or 29).

FIG. 27A is a top view of the electrical device of the present invention; the substrate is manufactured by the third method of second preferred embodiment of substrate.

FIG. 27B is a cross-sectional view of the electrical device of FIG. 27A.

FIG. 28A is a partially enlarged perspective view of FIG. 28B.

FIG. 28B is a cross-sectional view of electrical device of the present invention; the substrate is manufactured by the third method of second preferred embodiment of substrate.

FIGS. 36A-36D show cross-sectional views of a step for manufacturing an electrical device, the substrate is manufactured by the third method of second preferred embodiment of substrate, wherein FIG. 36B-1 is a cross-sectional view showing the die 25B is not removed, and FIG. 36B-2 is a cross-sectional view showing the die 25B is removed.

DETAILED DESCRIPTION OF THE INVENTION

Figure 2:
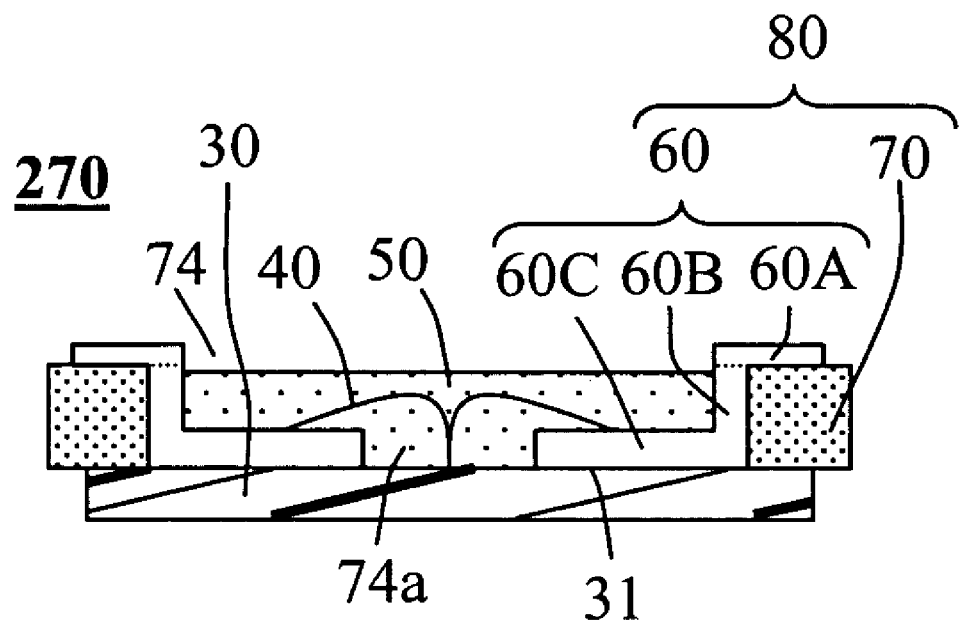
FIGS. 2-3 are cross-sectional views show embodiments of electrical device according to the present invention, the substrate is manufactured by the first method of first preferred embodiment of substrate.

Embodiments of the present invention will be explained with reference to the drawings as follow.

First Embodiment

A first embodiment of the present invention will be explained with reference to FIGS. 1A-1F, which is a first method for manufacturing the first embodiment of substrate of the present invention.

FIG. 1A shows providing a conductive plate 65 such as copper foil.

FIGS. 1B, 1Ba (FIG. 1Ba is a side view of FIG. 1B.) show by means of etching process, a plurality of protruding portions 66, upper portions 67 and recessed portions 69 formed by the conductive plate 65, each protruding portion 66 has a lower surface 62, and each upper portion 67 connects to each protruding portion 66, then the protruding portion 66 is adjacent to each other. In this manner, a plurality of gaps 661 formed, the gaps 661 are between the protruding potions 66 and another protruding potions 66.

FIG. 1C shows providing a soluble insulating material 53 which placed into the recessed portion 69;

FIG. 1D, 1Da (FIG. 1Da is a side view of FIG. 1D) show providing a filling process of insulator for filling the insulator 70 into the gaps 661, then the insulator 70 encapsulates the protruding portions 66, upper portions 67 and the soluble insulating material 53, wherein the lower surface 62 of protruding portion 66 and the lower surface 532 of soluble insulating material 53 exposed to the lower surface 72 of insulator 70. The insulator 70 may be formed by insulative resin, ceramics, powder-shaped insulative materials or the like; By means of a solidifying process, the insulator 70 becomes a solid state, then providing a plurality of dry films 54 which attached to the upper portion 67 and both the lower surface 62 of protruding portion 66 and the lower surface 72 of insulator 70 for etching the upper portion 67 and the protruding portions 66;

FIG.1E, 1Ea (FIG. 1Ea is a partially enlarged perspective view of FIG. 1E) show after etching process, a plurality of conductive elements 60 formed, both the soluble insulating material 53 and the dry films 54 removed, then the substrate 80 is formed, wherein the substrate 80 comprising an insulator 70 having a recess 74; and a plurality of conductive elements 60, wherein each conductive element 60 is staircase-shaped, and each conductive element 60 having a first portion 60A, a second portion 60B and a third portion 60C; the conductive element 60 encapsulated by the insulator 70 and embedded in the insulator 70, wherein the second surface 60A2 of first portion 60A and the second surface 60B2 of second portion 60B are also encapsulated by the insulator 70. The conductive element 60 extending from the insulator 70 surface 71 to the recess 74. The first portion 60A exposed to the insulator 70 surface 71, wherein the first portion 60A protrudes and exposes the insulator 70 surface 71. In this manner, it is easy for the conductive element 60 to electrically connect to outside, then the solder ball is not needed. Moreover, the substrate 80 thickness is thinner, the cost for manufacturing the substrate 80 decreased. Furthermore, due to the conductive elements 60 embedded in the insulator 70. Each conductive element 60 surface contacted with the insulator 70 increased, then the conductive element 60 encapsulated by the insulator 70 more securely, and the reliability of substrate 80 enhanced; In addition, the electrical surface 60C1 of third portion 60C exposed to the insulator 70 for electrically connecting to either a chip or an electrical device, wherein the electrical surface 6001 of third portion 60C is within the recess 74 of insulator 70 of substrate 80. The second portion 60B connects both first portion 60A and third portion 600, and then the second portion 60B is between first portion 60A and third portion 600. Wherein a co-planar surface "M" formed by the first portion 60A and the second portion 60B. A co-planar surface "Q" formed by the second portion 60B and the third portion 600, These co-planar surfaces "M and Q " exposed to the insulator 70 for electrical connection(refer to FIG. 3), In addition, by means of plating process, the conductive element 60 may be plated by a conductive material such as nickel, gold, palladium or the like, then the conductive element 60 may be more convenient to electrically connect to outside; The recess 74 is used for placing chip, conductive wires, encapsulant, transparent plate, electrical device and so on; Furthermore, (refer to FIG. 1Ea, the FIG. 1Ea is a partially enlarged perspective view of FIG. 1F) a wall-shaped insulator 70w which is between the third portion 60C and another third portion 600 is formed by the insulator 70, due to the wall-shaped insulator 70w, the insulator 70 surface contacted with an encapsulant(not shown) increased, then the substrate 80 encapsulated by the encapsulant(not shown )more securely, and the reliability of substrate 80 enhanced; wherein the wall-shaped insulator 70w may be removed(refer to FIG. 1F) as required. In addition, the recess 74 has an opening 74a. Then conductive wires (see "40" in FIG. 2) may go through said opening 74a; Wherein if the soluble insulating material 53 is omitted, the insulator 70 will be filled into the recessed portion 69, and the recess 74 may be formed by a cutting tool; the first portion 60A of conductive element 60 further including a side edge 60A5; FIG. 1F shows the wall-shaped insulator 70w between the third portion 60C and another third portion 60C been removed; the recess 74 further including a bottom 74b.

Figure 3:
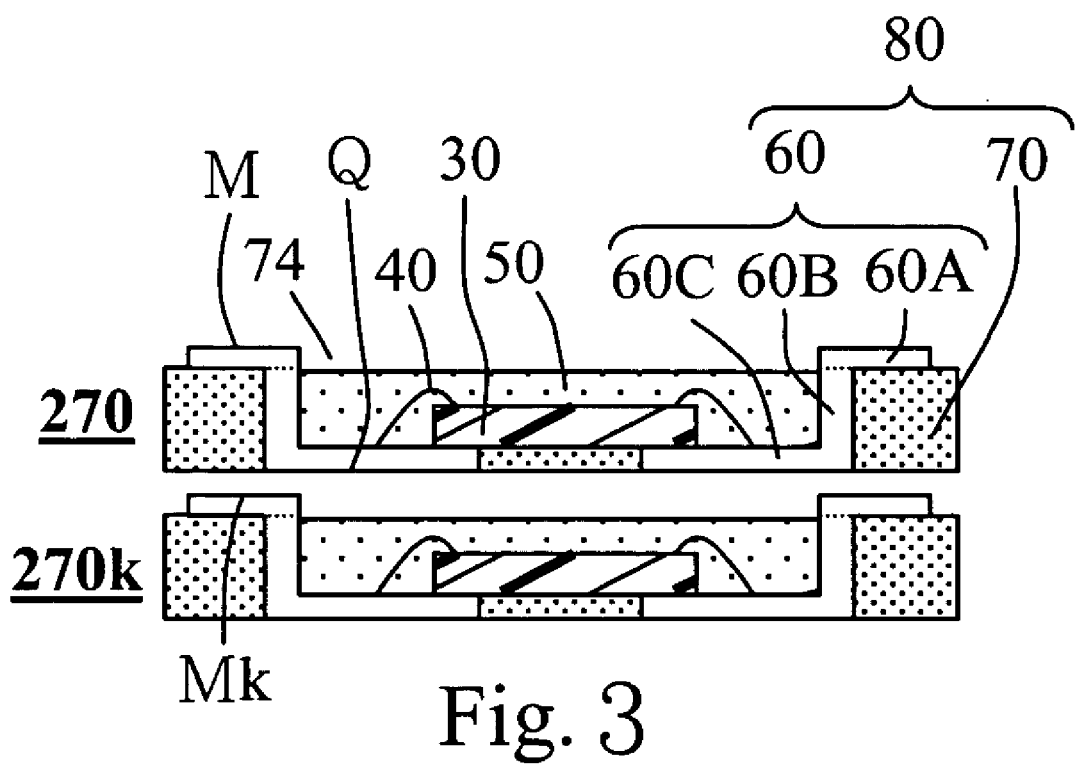

FIGS. 2-3 show embodiments of electrical device in accordance with the present invention, the substrate of electrical device is manufactured by the first method of first preferred embodiment of substrate related to this invention.

FIG. 2 shows an electrical device 270 comprising a substrate 80; a chip 30 having an active surface 31 which is coupled with the substrate 80; A plurality of conductive wires 40 electrically connect the chip 30 to the third portions 60C of conductive elements 60 respectively, wherein the conductive wires 40 go through the opening 74a; An encapsulant 50 encapsulates the substrate 80, conductive wires 40 and the chip 30, wherein the encapsulant 50 is placed in the recess 74 of the substrate 80. Wherein the substrate 80 may be coupled with the active surface 31 of chip 30 by an adhesive mean (not shown) such as adhesive tape, glue or the like. In this manner, the adhesive mean (not shown) is between the substrate 80 and the active surface 31 of chip 30.

FIG. 3 shows an electrical device 270 stacked on another electrical device 270k, wherein the co-planar surface "Q" of electrical device 270 electrically connecting to the co-planar surface "Mk" of electrical device 270k.

Another embodiment of the present invention will be explained with reference to FIGS. 4A-4D which is the second method for manufacturing the first embodiment of substrate of the present invention, wherein a portion of the conductive element protrudes and exposes the insulator. Then it is not necessary for the conductive element to electrically connect to outside by means of solder ball, moreover the conductive elements embedded in the insulator. In this manner, the reliability of substrate enhanced. In addition, the substrate of the present invention may further comprise a submember (refer to FIG. 7) for enhancing heat dissipation. Detailed descriptions as follow:

FIGS. 4A, 4Aa (FIG. 4Aa is a side view of FIG. 4A) shows providing a conductive plate 65 such as copper foil, the conductive plate 65 having a recessed portion 65a which is for forming upper portion 67.

FIGS. 4B, 4Ba (FIG. 4Ba is a side view of FIG. 4B) show By means of etching process, a recessed portion 69 formed by the conductive plate 65.

FIG. 4C shows providing a soluble insulating material 53 which is placed into the recessed portion 69;

FIG. 4D shows providing a plurality of dry films 54 which attached to the conductive plate 65 for etching.

FIGS. 4E, 4Ea (FIG. 4Ea is a side view of FIG. 4E) show After etching process, a plurality of protruding portions 66 and upper portion 67 formed by the conductive plate 65, wherein the upper portion 67 connects to each protruding portion 66, then the protruding portions 66 are adjacent to each other. In this manner, a plurality of gaps 661 formed which are between the protruding potions 66 and the others.

FIGS. 4F, 4Fa (FIG. 4Fa is a side view of FIG. 4F) show providing a filling process of insulator for filling the insulator 70 into the gaps 661, then the insulator 70 encapsulates the protruding portions 66, upper portion 67 and the soluble insulating material 53, then by means of a solidifying process, the insulator 70 becomes a solid state;

FIGS. 4G, 4Ga (FIG. 4Ga is a side view of FIG. 4G) show providing a plurality of dry films 54 which are onto the upper portion 67 for etching;

FIGS. 4H, 4Ha (FIG. 4Ha is a side view of FIG. 4H) show after etching process, a plurality of conductive elements 60 formed, both the soluble insulating material 53 and the dry films 54 removed, then the substrate 80 is formed, wherein the substrate 80 comprising an insulator 70 having a recess 74; and a plurality of conductive elements 60, wherein each conductive element 60 is staircase-shaped, and each conductive element 60 having a first portion 60A, a second portion 60B and a third portion 60C; the conductive element 60 encapsulated by the insulator 70 and embedded in the insulator 70, wherein a portion 60A3 of first portion 60A encapsulated by the insulator 70. The conductive element 60 extending from the insulator 70 surface 71 to the recess 74, wherein a portion of first portion 60A protrudes and exposes the insulator 70 surface 71. In this manner, it is easy for the conductive element 60 to electrically connect to outside, then the solder ball is not needed. Moreover, the substrate 80 thickness is thinner, the cost for manufacturing the substrate 80 decreased. Furthermore, due to the conductive elements 60 embedded in the insulator 70. Each conductive element 60 surface contacted with the insulator 70 increased, then the conductive element 60 encapsulated by the insulator 70 more securely, and the reliability of substrate 80 enhanced; In addition, the third portion 60C is within the recess 74 of insulator 70 of substrate 80, and the third portion 60C exposed to the insulator 70 for electrically connecting to either a chip or an electrical device. The second portion 60B is between first portion 60A and third portion 60C. Furthermore, the first portion 60A may be co-planar with the insulator 70 surface 71 (refer to FIG. 6) as required.

Figure 5:
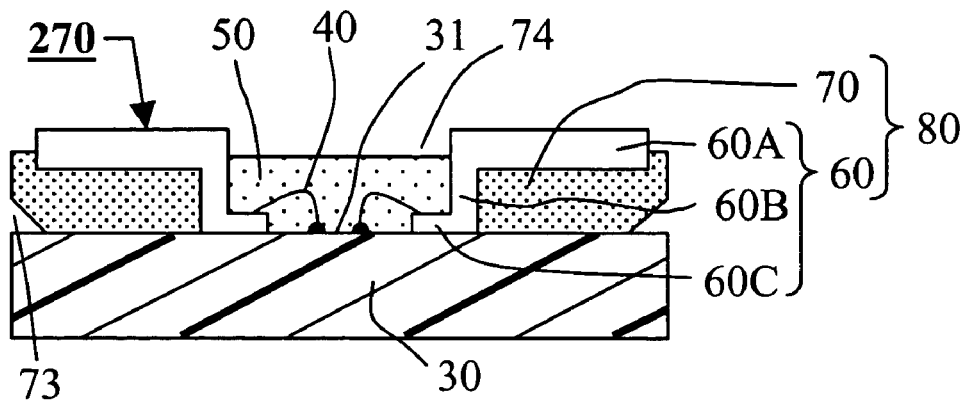
FIGS. 5-7 are cross-sectional views show embodiments of electrical device according to the present invention, the substrate is manufactured by the second method of first preferred embodiment of substrate.
Figure 6:
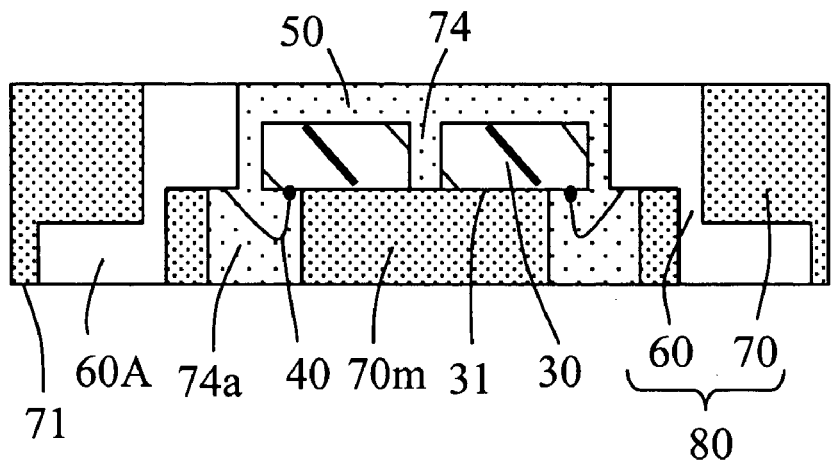
Figure 7:
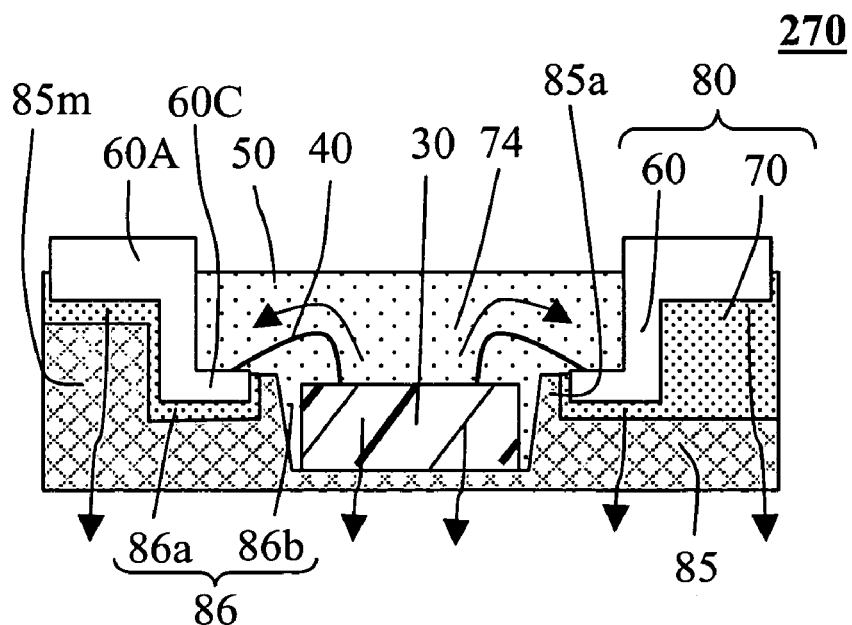

FIGS. 5-7 show embodiments of electrical device in accordance with the present invention, the substrate of electrical device is manufactured by the second method of first preferred embodiment of substrate related to this invention.

FIG. 5 shows the insulator 70 having a recessed portion 73 which is used for preventing the substrate 80 from peeling off the chip 30 while operating a sawing process (refer to FIG. 36D). In addition, The material of insulator 70 will be saved because of the recessed portion 73.

FIG. 6 shows an insulator 70 having a portion 70m, a chip 30 coupled with the portion 70m, meanwhile, the surface of the first portion 60A of conductive element 60 is co-planar with the insulator 70 surface.

FIG. 7 shows a submember 85 having a plurality of protruding portions 85a, 85m and a recess 86, said submember 85 serving as a heat spreader, said recess 86 of submember 85 having a first portion 86a, a second portion 86b, said submember 85 encapsulated by the insulator 70. In this manner, a portion of insulator 70 and the third portion 60C of conductive element 60 are within the first portion 86a of recess 86 (both the insulator 70 and the third portion 60C of conductive element 60 may be within the first portion 86a of recess 86; refer to FIG. 31), wherein the insulator 70 is between the conductive element 60 and the submember 85. A chip 30 placed in the second portion 86b of recess 86 and mounted thereon. Due to the protruding portion 85m gets closer to the first portion 60A of conductive element 60, then the heat dissipation of chip 30 enhanced. (Because the chip 30 generated heat during operation, wherein one of the path of heat dissipation is from chip 30 passing through conductive wires 40, conductive elements 60, insulator 70 then to the submember 85, According to the mentioned-above path of heat dissipation, The closer both the conductive element 60 and the submember 85 are, the cooler the chip 30 is). In this manner, the reliability of electrical device 270 enhanced; Moreover, the protruding portion 85a of submember 85 is used for preventing the insulator 70 from overflowing into the recess 74 of insulator 70 while operating the filling process of insulator, wherein the recess 86 of submember 85 serving as a portion of the recess 74 of insulator 70.

Figure 8:
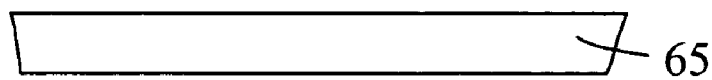
FIGS. 8A-8E show cross-sectional views of a step of third method for manufacturing a first preferred embodiment of substrate of the present invention, wherein FIG. 8Ba is a side view of FIG. 8B, and FIG. 8Ea is a partially enlarged perspective view of FIG. 8E.
Figure 8:
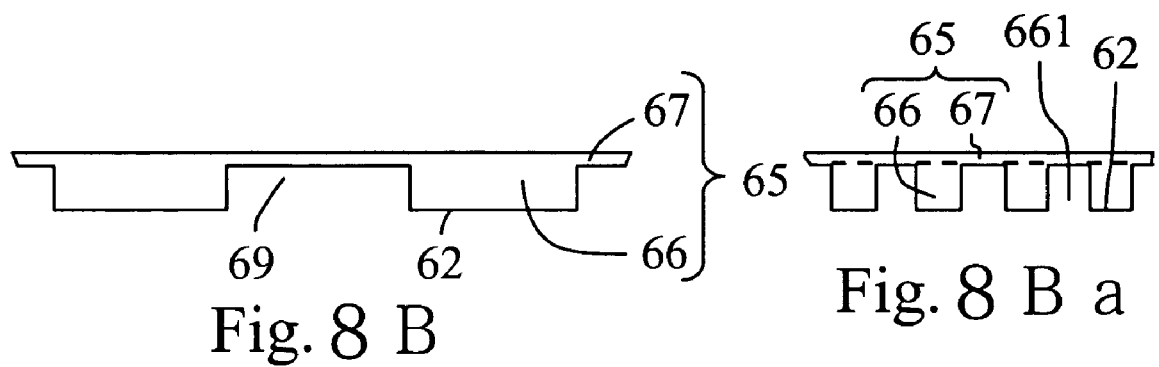
Figure 8:
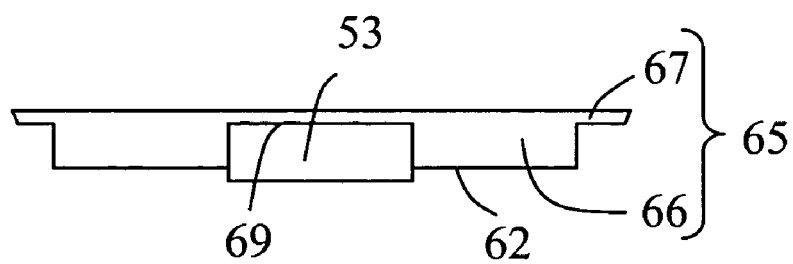

Further another embodiment of the present invention will be explained with reference to FIGS. 8A-8E, which is the third method for manufacturing the first embodiment of substrate of the present invention, wherein a portion of the conductive element protrudes and exposes the insulator. Then it is not necessary for the conductive element to electrically connect to outside by means of solder ball, moreover the conductive element embedded in the insulator. In this manner, the reliability of substrate enhanced. The detailed descriptions as follow:

FIG. 8A shows providing a conductive plate 65 such as copper foil.

FIGS. 8B, 8Ba (FIG. 8Ba is a side view of FIG. 8B) show by means of etching process, a plurality of protruding portions 66, upper portion 67 and recessed portion 69 formed by the conductive plate 65, wherein each protruding portion 66 has a lower surface 62, and the upper portion 67 connects to each protruding portion 66 then the protruding portions 66 are adjacent to each other. In this manner, a plurality of gaps 661 formed, the gaps 661 are between the protruding potions 66 and the others.

FIG. 8C shows providing a soluble insulating material 53 which is placed into the recessed portion 69;

FIGS. 8D, 8Da (FIG. 8Da is a side view of FIG. 8D) show providing a filling process of insulator for filling the insulator 70 into the gaps 661, then the insulator 70 encapsulates the protruding portions 66, upper portion 67 and the soluble insulating material 53, wherein the lower surface 62 of protruding portion 66 and the lower surface 532 of soluble insulating material 53 also encapsulated by the insulator 70. By means of a solidifying process, the insulator 70 becomes a solid state, then providing a plurality of dry films 54 which attached to the upper portion 67 for etching the upper portion 67; Furthermore, a submember (not shown) such as heat spreader may attach to the lower surface 532 of soluble insulating material 53 and be encapsulated by the insulator 70 as required, then the heat dissipation of substrate 80 enhanced (i.e. the reliability of substrate 80 enhanced.)

FIGS. 8E, 8Ea (FIG. 8Ea is a partially enlarged perspective view of FIG. 8E) show after etching process, a plurality of conductive elements 60 formed, both the soluble insulating material 53 and the dry films 54 removed, then the substrate 80 is formed, wherein the substrate 80 comprising an insulator 70 having a recess 74, a plurality of conductive elements 60, wherein each conductive element 60 is staircase-shaped, and each conductive element 60 having a first portion 60A, a second portion 60B and a third portion 60C; the conductive elements 60 encapsulated by the insulator 70 and embedded in the insulator 70, wherein the conductive element 60 extending from the insulator 70 surface 71 to the recess 74. Both the first portion 60A and the second portion 60B protrude and expose the insulator 70 surface 71. In this manner, it is easy for the conductive element 60 to electrically connect to outside, then the solder ball is not needed. Moreover, the substrate 80 thickness is thinner, the cost for manufacturing the substrate 80 decreased. Furthermore, due to the conductive elements 60 embedded in the insulator 70. Each conductive element 60 surface contacted with the insulator 70 increased, then the conductive element 60 encapsulated by the insulator 70 more securely, and the reliability of substrate 80 enhanced; wherein the electrical surface 60C1 of third portion 60C is within the recess 74 of insulator 70 of substrate 80 and exposed to the insulator 70 for electrically connecting to either a chip or an electrical device, The second portion 60B is between first portion 60A and third portion 60C, wherein a height "F" which is between the co-planar surface "M" and the insulator 70 surface 71, If the height "F" is ≧0.01 m.m., then the co-planar surface "M" may be more convenient for electrical connection. Furthermore, (refer to FIG. 8Ea, the FIG. 8Ea is a partially enlarged perspective view of FIG. 8E) a wall-shaped insulator 70w which is between the third portion 60C and another third portion 60C is formed by the insulator 70, due to the wall-shaped insulator 70w, the insulator 70 surface contacted with an encapsulant (not shown) increased, then the substrate 80 encapsulated by the encapsulant (not shown) more securely, and the reliability of substrate 80 enhanced wherein the wall-shaped insulator 70w may be removed as required.

FIGS. 9-14 show embodiments of electrical device according to the present invention, the substrate of electrical device is manufactured by the third method of first preferred embodiment of substrate related to this invention.

Figure 9:
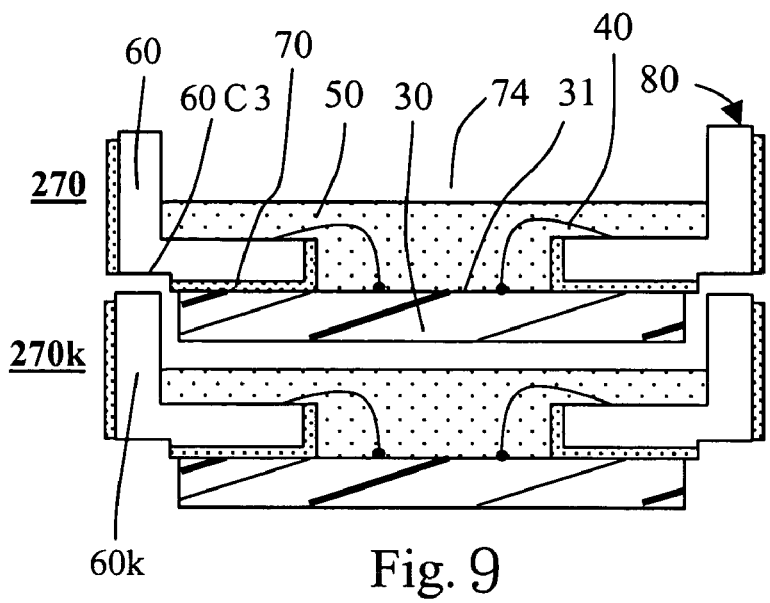

FIG. 9 shows a portion 60C3 of conductive element 60 exposed to the insulator 70, then the electrical device 270 enables to be stacked on another electrical device 270k.

Figure 10:
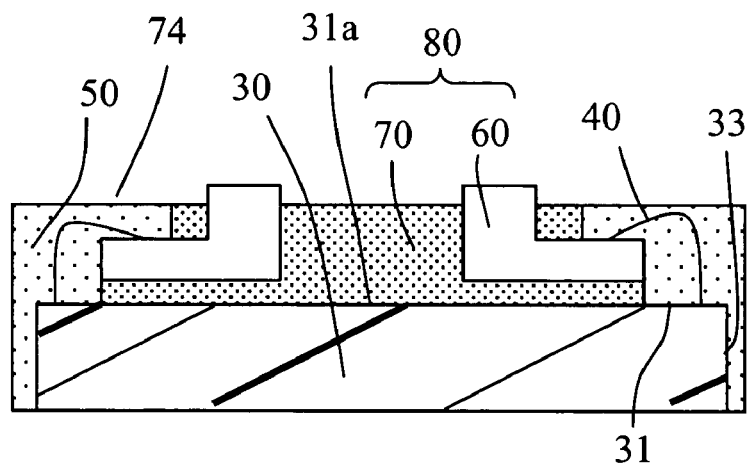

FIG. 10 shows the substrate 80 coupled with the central area 31a of active surface 31 of chip 30; a plurality of conductive wires 40 electrically connected the conductive elements 60 to a plurality of bond pads (not shown) disposed on the periphery of chip 30 respectively, wherein the encapsulant 50 encapsulates the side edge 33 of chip 30 too.

Figure 11:
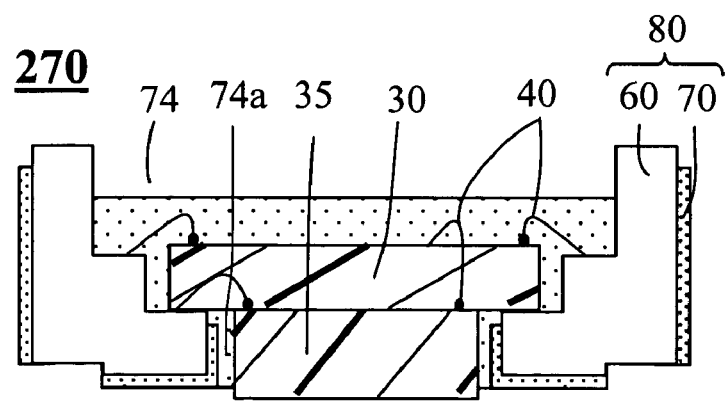

FIG. 11 shows each conductive element 60 is multi-staircase-shaped, in this manner, the chip 30 enables to be stacked on the chip 35, then the electrical device 270 is more powerful.

FIGS. 12A, B (FIG. 12B is a cross sectional view of FIG. 12A) show a conductive element 60a having a through hole 64a which serving as a portion of the recesses 74, wherein the conductive element 60a is for power supply, signal transfers, and electromagnetic interference prevention.

FIG. 13 shows a submember 85 serving as heat spreader mounted on the active surface 31 of chip 30, and the inactive surface 32 of chip 30 exposed to the encapsulant 50, In this manner, the heat dissipation of chip 30 enhanced.

FIG. 14 shows the insulator 70 of substrate 80 of electrical device 400 not having recess 74, wherein the first portion 60A, second portion 60B and third portion 60C of conductive element 60 having a co-planar surface "S".

Second Embodiment

Figure 15:
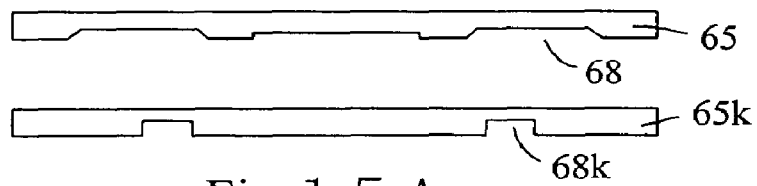
FIGS. 15A-15H show cross-sectional views of a step of first method for manufacturing a second preferred embodiment of substrate of the present inventions, wherein FIG. 15Da is a partially top view of partial portion of FIG. 15D, FIG. 15Ha is a partially top view of FIG. 15H, and FIG. 15Hb is a partially bottom view of FIG. 15H.
Figure 15:
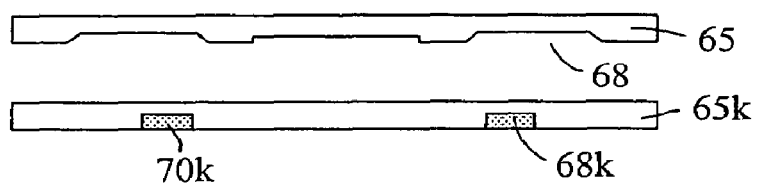
Figure 15:
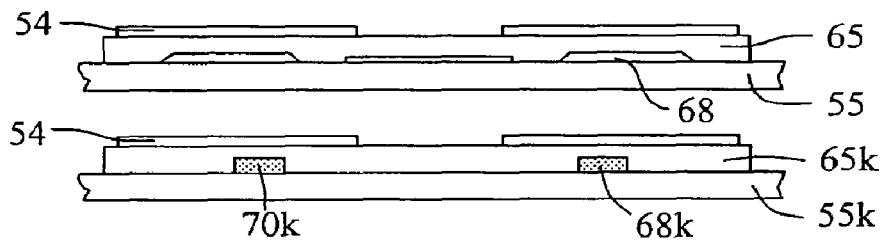

An embodiment of the present invention will be explained with reference to FIGS. 15A-15H, which is the first method for manufacturing the second embodiment of substrate of the present invention, wherein the conductive element having a recessed portion which is encapsulated by an insulator and not exposed to the insulator, in this manner, the shape of conductive element becomes discontinuous according to the insulator surface. Moreover the conductive elements embedded in the insulator. In this manner, the reliability of substrate enhanced, and the substrate of the present invention may further comprise a submember such as chip, heat spreader etc. Detailed descriptions as follow:

FIG. 15A shows providing two conductive plates 65, 65k, wherein the conductive plates 65, 65k having a plurality of recessed portions 68, 68k respectively;

FIG. 15B shows filling an insulator 70k such as glue, adhesive tape or the like into the recessed portion 68k of conductive plate 65k;

FIG. 15C shows attaching the adhesive means 55, 55k to the conductive plates 65, 65k respectively, and attaching the dry films 54 to the conductive plates 65, 65k for etching.

Figures 15, 15D:
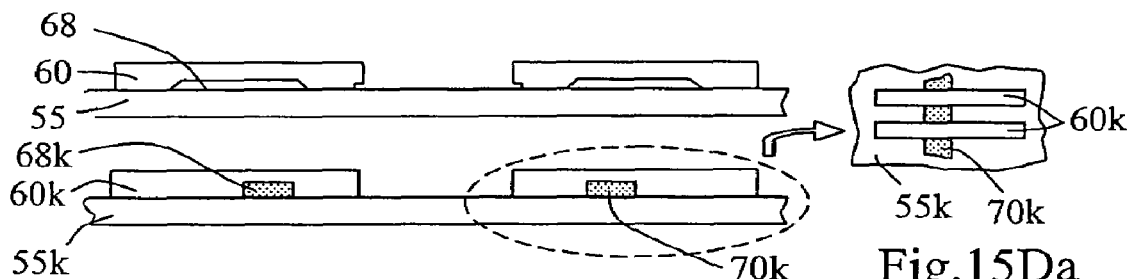
Figure 15:
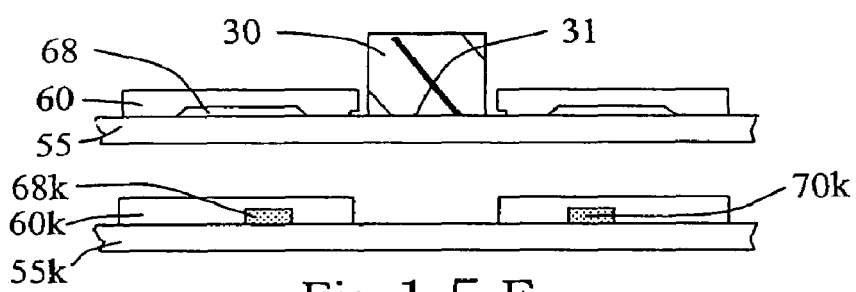

FIG. 15D shows after etching, the dry films 54 removed, a plurality of conductive elements 60, 60k are formed by the conductive plates 65, 65k which are coupled with the adhesive means 55, 55k respectively; wherein due to the insulator 70k coupled with both the recessed portions 68k of conductive element 60k and the adhesive mean 55k simultaneously, in this manner, the conductive elements 60k coupled with the adhesive mean 55k more securely, and the insulator 70k prevents the conductive elements 60k from peeling off the adhesive mean 55k; Moreover, after the filling process of insulator 70 (refer to FIG. 15H) accomplished, wherein the insulator 70 encapsulates the conductive elements 60k and insulator 70k, then the conductive elements 60k and the insulator 70k embedded in the insulator 70, in this manner, the conductive elements 60k are held by the insulator 70k and the insulator 70 more securely;

FIG. 15E shows providing an attaching process of submember for attaching the active face 31 of chip 30 to the adhesive mean 55, then the chip 30 is surrounded by the conductive elements 60, wherein the chip 30 may be coupled with the conductive elements 60 by an adhesive mean (refer to the "55" in FIG. 43E), wherein a heat spreader or a transparent plate may be instead of the chip 30 as required; The attaching process of submember is optional;

FIG. 15F shows the adhesive mean 55 with conductive elements 60 and the chip 30, and the adhesive mean 55k with conductive elements 60k placed in the dies 25A, 25Ad which having a projected portions 25f, 25fd respectively, wherein the adhesive means 55, 55k coupled with the projected portions 25f, 25fd respectively;

FIG. 15G shows filling the pressurized-liquid insulator 70 into the space between the adhesive mean 55 and adhesive mean 55k, then the pressurized-liquid insulator 70 encapsulates and squeezes the adhesive means 55/55k, conductive elements 60/60k, the recessed portions 68 and the insulator 70k, so that each conductive element 60/60k formed a predetermined shape along the projected portions 25f/25fd respectively; then each conductive element 60/60k having a first portion 60A/60kA, a second portion 60B/60kB and a third portion 60C/60kC respectively;

FIG. 15H shows After a solidifying process, the insulator 70 becomes a solid state, and the adhesive means 55/55k and the dies 25A/25Ad removed, then the substrate 80 formed, the substrate 80 having an insulator 70 which having a recess 74; a plurality of conductive elements 60/60k which are corresponding to each other, wherein each conductive element 60 is staircase-shaped, each conductive element 60 having a first portion 60A, a second portion 60B and a third portion 60C, and the conductive element 60 further having an electrical surface 601 which consists of the electrical surface 60A1 of first portion 60A, the electrical surface 60B1 of second portion 60B and the electrical surface 60C1 of third portion 60C; the conductive element 60 encapsulated by the insulator 70 and embedded therein, the conductive element 60 extending from the insulator 70 surface 71 to the recess 74; the first portion 60A exposed to the insulator 70 surface 71 for electrical connection, the third portion 60C is within the recess 74 of insulator 70 of substrate 80 and the electrical surface 60C1 exposed to the insulator 70 for electrical connection, wherein due to the electrical surface 60B1 of second portion 60B encapsulated by the insulator 70 and not exposed to the insulator 70, in this manner, the shape of conductive element 60 becomes discontinuous according to the insulator 70 surface. Moreover, due to the conductive element 60 embedded in the insulator 70, and the electrical surface 60B1 of second portion 60B encapsulated by the insulator 70, then the conductive element 60 surface contacted with the insulator 70 increased, the conductive element 60 is rigidly held by the insulator 70, and the conductive element 60 encapsulated by the insulator 70 more securely. In this manner, the reliability of substrate 80 enhanced; In addition, when the insulator 70 became a solid liquid state, the chip 30 has already been positioned too, the advantages are: (a.) it is not necessary for the chip 30 to attach to the substrate 80 through an adhesive mean which is between the insulator 70 and the chip 30, then material saved, cost saved too, and (b.) the substrate 80 thickness is thinner; wherein the active surface 31 of chip 30 exposed to the insulator 70 for electrical connection, the chip 30 is below the recess 74 and embedded in the insulator 70, wherein the recess 74 having a bottom 74b which consists of the electrical surface 60C1 of third portion 60C, the insulator 70, surface 76 and the active surface 31 of chip 30.

Figure 16:
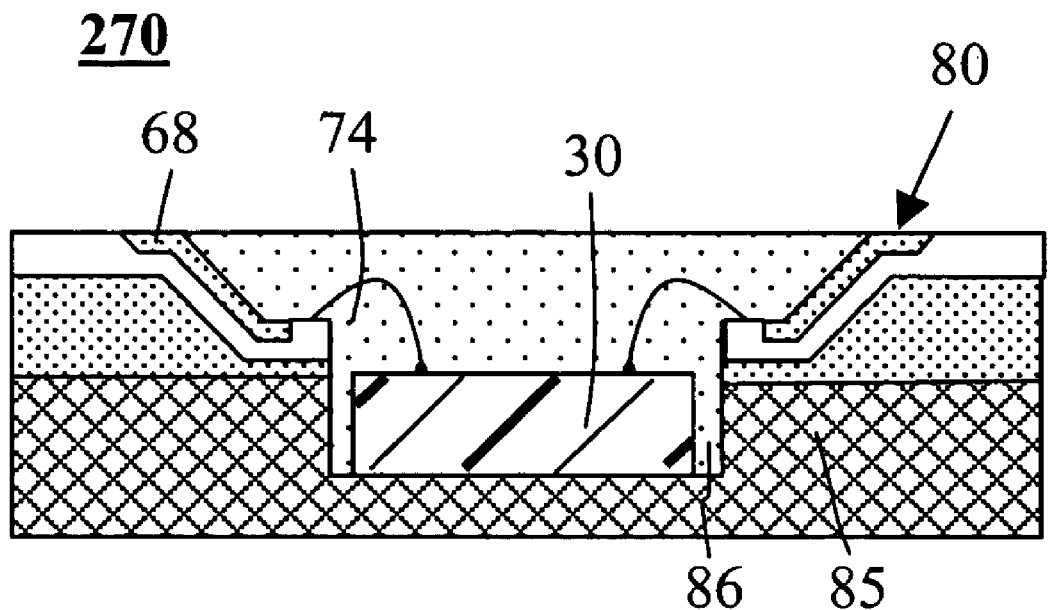
FIGS. 16-17 are cross-sectional views show embodiments of electrical device according to the present invention, the substrate is manufactured by the first method of second preferred embodiment of substrate.
Figure 17:
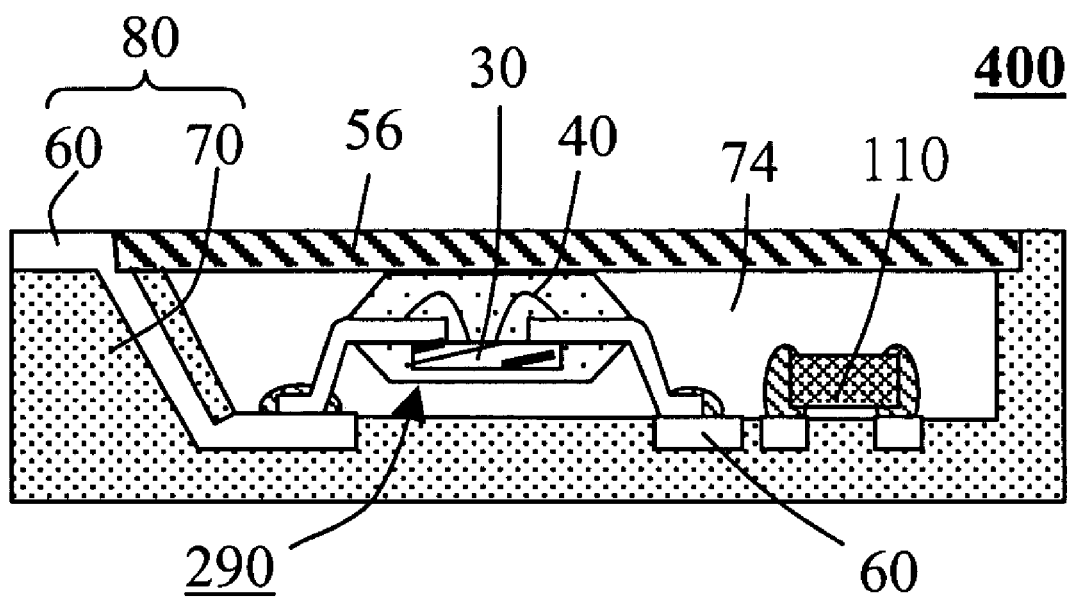

FIGS. 16-17 show embodiments of electrical device according to the present invention, the substrate of electrical device is manufactured by the first method of second preferred embodiment of substrate related to this invention.

FIG. 16 shows a submember 85 such as heat spreader coupled with the substrate 80 for enhancing the heat dissipation of chip 30.

FIG. 17 shows both the electrical device 290 and the component 110 placed in the recess 74 of substrate 80 of electrical device 400 and electrically connected to the conductive elements 60 of substrate 80, wherein the chip 30 placed in the electrical device 290, and the lid 56 hermetically sealed the recess 74.

Figure 18A:
FIGS. 18A-18D show cross-sectional views of a step of second method for manufacturing a second preferred embodiment of substrate of the present invention.
Figure 18B:
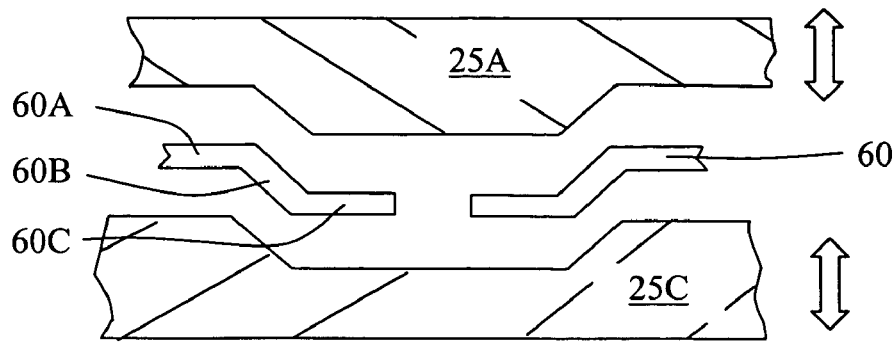
Figure 18C:
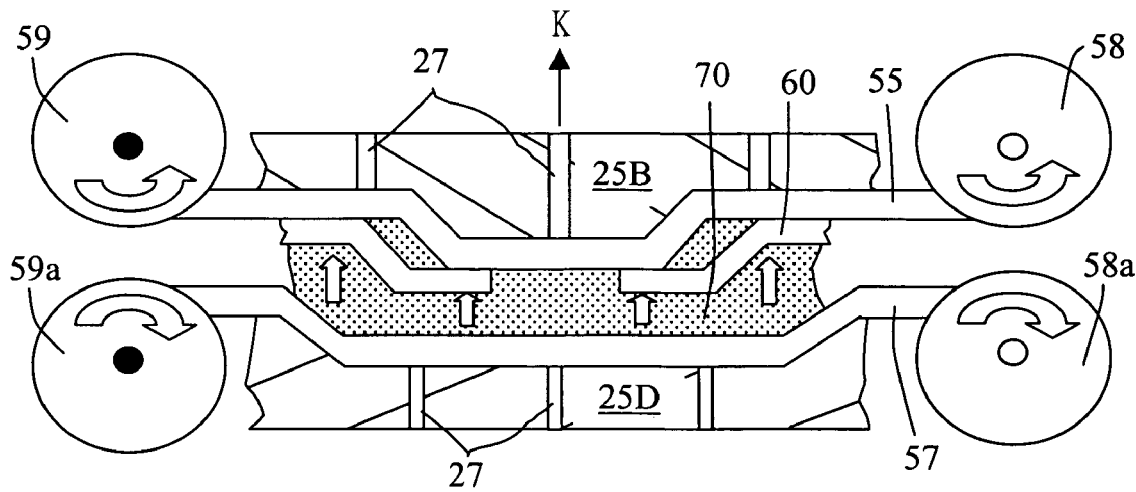
Figure 18D:
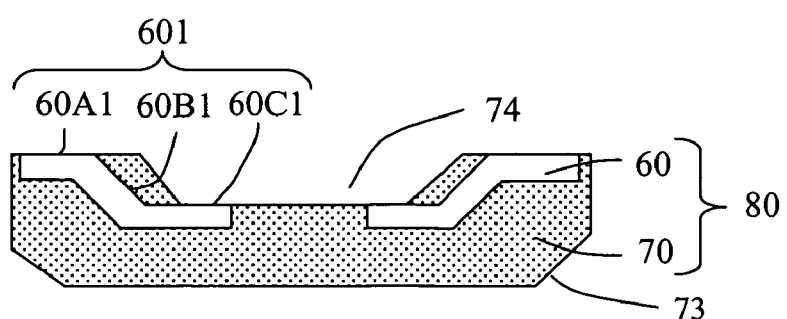
Figure 19:
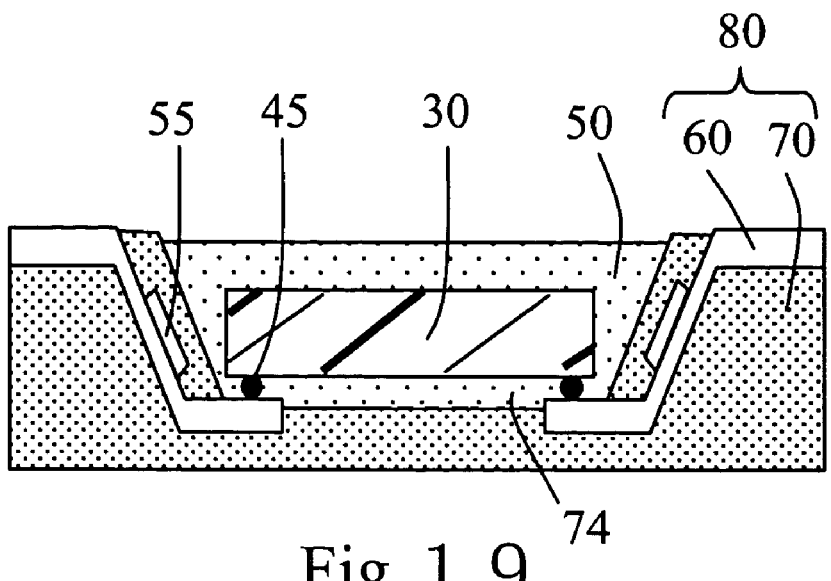
FIGS. 19-21 are cross-sectional views show embodiments of electrical device according to the present invention, the substrate is manufactured by the second method of second preferred embodiment of substrate.
Figure 20:
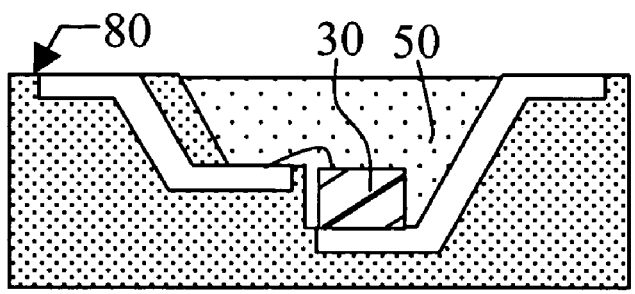
Figure 21:
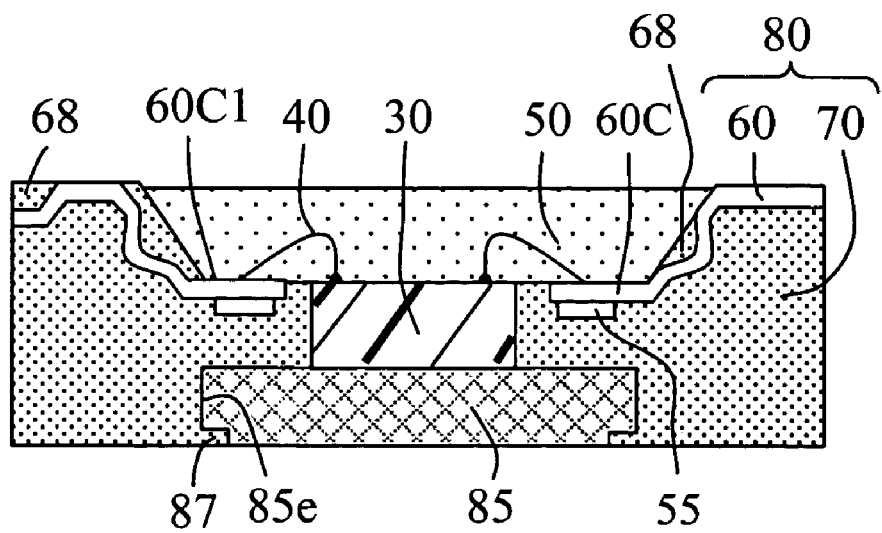

Another embodiment of the present invention will be explained with reference to FIGS. 18A-18D, which is the second method for manufacturing the second embodiment of substrate of the present invention, wherein a portion of the electrical surface of the conductive element encapsulated by an insulator and not exposed to the insulator, in this manner, the shape of conductive element becomes discontinuous according to the insulator surface. Moreover the conductive elements embedded in the insulator. In this manner, the reliability of substrate enhanced. In addition, the substrate of the present invention may further comprise a submember (refer to FIG. 21) for enhancing heat dissipation. Detailed descriptions as follow:

FIG. 18A shows providing a plurality of conductive elements 60 which serving as a plurality of leads of leadframe;

FIG. 18B shows By means of the pressing dies 25A, 25C, the first portion 60A, the second portion 60B and the third portion 60C of conductive element 60 formed;

FIG. 18C shows the dies 25B, 25D which having a plurality of vacuum hole 27, a vacuum supply "K" sucking the adhesive mean 55, the insulative film 57 onto the dies 25B, 25D through the vacuum holes 27, wherein the conductive elements 60 coupled with the adhesive mean 55; then filling the insulator 70 into the space between the adhesive mean 55 and the insulative film 57 for encapsulating the conductive elements 60, adhesive mean 55 and insulative film 57; after the insulator 70 became a solid state, both the conductive elements 60 and the insulator 70 separated from the adhesive mean 55, insulative film 57, then rotating the rollers 58, 58a for collecting the adhesive mean 55, insulative film 57 which have been used, at the same time, pulling the adhesive mean 55, insulative film 57 which have not been used for renew use from the rollers 59, 59a;

FIG.18D shows the substrate 80 is formed, wherein a portion 60B1 of electrical surface 601 of conductive element 60 encapsulated by the insulator 70, in this manner, the shape of conductive element 60 becomes discontinuous according to the insulator 70 surface, wherein the conductive element 60 surface contacted with the insulator 70 increased, the conductive element 60 is rigidly held by the insulator 70, and the conductive element 60 encapsulated by the insulator 70 more securely, then the reliability of substrate 80 enhanced;

FIGS. 19-21 show embodiments of electrical device according to the present invention, the substrate of electrical device is manufactured by the second method of second preferred embodiment of substrate related to this invention.

FIG. 19 shows an adhesive mean 55 attached to the conductive elements 60, the adhesive mean 55 is used for preventing the conductive elements 60 from being warped by the insulator 70 while operating the filling process of insulator 70, wherein the chip 30 having a plurality of conductive bumps 45 which electrically connected the chip 30 to the conductive elements 60.

FIG. 20 shows the encapsulant 50 is formed by transparent material, the chip 30 serving as an optical chip/sensor.

FIG. 21 shows a submember 85 having a side edge 85e and a recessed portion 87, the submember 85 encapsulated by the insulator 70, wherein the submember 85 with the side edge 85e and the recessed portion 87 embedded in the insulator 70. Due to the side edge 87 and the recessed portion 87 embedded in the insulator 70, In this manner, the submember 85 held by the insulator 70 more securely, then the submember 85 prevented from peeling off the insulator 70. In addition, the recessed portions 68 of conductive element 60 formed after the conductive element 60 pressed by a molding die as required.

Further another embodiment of the present invention will be explained with reference to FIGS. 22A-22D, which is the third method for manufacturing the second embodiment of substrate of the present invention, wherein the conductive elements encapsulated by an insulator, in this manner, the conductive elements embedded in the insulator. then, the reliability of substrate enhanced. In addition, the substrate of the present invention may further comprise a submember (refer to FIG. 29) for enhancing heat dissipation. Detailed descriptions as follow:

FIG. 22A-1 shows providing a plurality of conductive elements 60 which attached to the adhesive mean 55; Wherein the adhesive mean 55 may have a plurality of openings 55c (shown in FIG. 22A-2 and FIG. 22A-2a; FIG. 22A-2a is a top view of FIG. 22A-2) as required, wherein each opening 55c is corresponding to the conductive element 60, in this manner, a portion of the conductive element 60 enables to expose the adhesive mean 55 for electrical connection, then the adhesive mean 55 has been not removed (see FIG. 22D-2);

FIG. 22B shows By means of the pressing dies 25B, 25C, the first portion 60A, second portion 60B and the third portion 60C of conductive element 60 formed; each conductive element 60 becomes staircase-shaped, wherein the process (FIG. 22B) is optional;

FIGS. 22C, 22Ca (FIG. 22Ca is a side view of FIG. 22C) shows filling the insulator 70 into the space between adhesive mean 55 and die 25E, then the conductive element 60, adhesive mean 55 encapsulated by the insulator 70, wherein the die 25B having a plurality of projected portions 25j, then the substrate 80 surface 81 becomes wave-shaped, and each conductive element 60 positioned at each top of the waveshaped substrate 80 surface 81, In this manner, the conductive element 60 is more convenient to electrically connect to outside; Nevertheless, the projected portions 25j may be optional as required, Once the projected portions 25j omitted, then the conductive element 60 surface which exposed to the insulator 70 may be co-planar with the insulator 70 surface; Moreover, the die 25E may attach to the second surface 60C2 of third portion 60C through an insulative film (not shown) as required, then the second surface 60C2 of third portion 60C may be exposed to the insulator 70, after the insulative film (not shown) removed;

FIG. 22D-1 and FIG. 22D-2 show the substrate 80 formed, wherein FIG. 22D-1 shows the substrate 80 comprising an insulator 70 having a recess 74; a plurality of conductive elements 60 which are staircase-shaped and embedded in the insulator 70, the conductive elements 60 extending from the insulator 70 surface 71 to the recess 74, wherein the electrical surface 601 of conductive element 60 exposed to the insulator 70; FIG. 22D-2 shows the first portion 60A of conductive element 60 having a side edge 60A5 which exposed to the side wall 705 of insulator 70, in this manner, the side edge 60A5 enables to electrically connect to outside. Furthermore, by means of the side edge 60A5, a tester which equipped with a plurality of testing probes enables to test a chip for checking if the chip is good or not (refer to the "P" in FIG. 36C), and the first portion 60A of conductive element 60 may further have an extending portion (refer to the "603" in FIG. 29) as required; and the adhesive mean 55 has been not removed from the substrate 80.

FIGS. 23-35 show embodiments of electrical device according to the present invention, the substrate of electrical device is manufactured by the third method of second preferred embodiment of substrate related to this invention.

FIG. 23 shows an insulative layer 75 attached to the substrate 80 and the encapsulant 50 thereon, the insulative layer 75 having a plurality of openings 75a, then a portion of conductive element 60 can be exposed to the insulative layer 75 for electrical connection, wherein the insulative layer 75 is also used for preventing moisture from getting into the electrical device 270.

FIG. 24 shows an electrical device 270 having two substrates 80, 80k, wherein the conductive element 60 encapsulated by the insulator 70 of substrate 80. The first portion 60A, second portion 60B and third portion 60C do not have a co-planar surface (refer to the "S" in FIG. 14), and both the second surface 60A2 of first portion 60A and the second surface 60B2 of second portion 60B encapsulated by the insulator 70. Nevertheless, the second surface 60C2 of third portion 60C does not be encapsulated by the insulator 70 (i.e. the second surface 60C2 of third portion 60C exposed to the insulator 70) for electrical connection. Meanwhile, the second surface 60kC2 of second portion 60kC of substrate 80k exposed to the insulator 70k too, and then the second surface 60C2 of third portion 60C enables to electrically connect to the second surface 60kC2 of third portion 60kC. In this manner, the substrate 80 stacked on another substrate 80k; the electrical device 270 stacked on another electrical device 270d through the first portion 60kA and the first portion 60dA.

FIG. 25 shows both the chip 30 and the component 110 placed in the recess 74 of substrate 80 and electrically connected to the conductive elements 60 of substrate 80, wherein the recess 74 of insulator 70 of substrate 80 is not hermetically-sealed, the second surface 60C2 of third portion 60C may be for electrical connection.

FIG. 26 shows a submember 95 serving as a transparent plate which placed in the recess 74 and encapsulated by the encapsulant 50, then a hermetically-sealed space 74c between the submember 95 and the chip 30 is formed, wherein the chip 30 serving as optical chip, MEMS chip or LED chip.

FIGS. 27A, 27B (FIG. 27B is a cross-sectional view of FIG. 27A) show the substrate 80 of electrical device 400 having a plurality of terminals 48 and predetermined-shaped conductive elements 60, 60j, 60m, wherein the conductive elements 60, 60j, 60m electrically connected to the terminals 48 respectively, the terminals 48 are for external connection, and the conductive elements 60m may be electrically connected to each other through a conductive material such as solder paste; and two electrical devices 270, 280 electrically connect to the substrate 80 respectively.

FIG. 28A, 28B (FIG. 28A is a partial perspective view of FIG. 28B) show two stackable chips 30 placed in the multi-stepped recess 74 of substrate 80; the third portion 60C of conductive element 60 and the third portion 60kC of conductive element 60k are positioned in different horizontal levels (see FIG. 28A), a plurality of conductive wires 40, 41 electrically connected the chips 30 to the third portion 60C, 60kC respectively. In this manner, the conductive wires 40, 41 are at different horizontal levels, the distance between conductive wire 40 and conductive wire 41 increased, then each conductive wire 40 and each conductive wire 41 can not touch each other. So that it prevents the electrical device 270 from causing short circuit problem.

Figure 29:
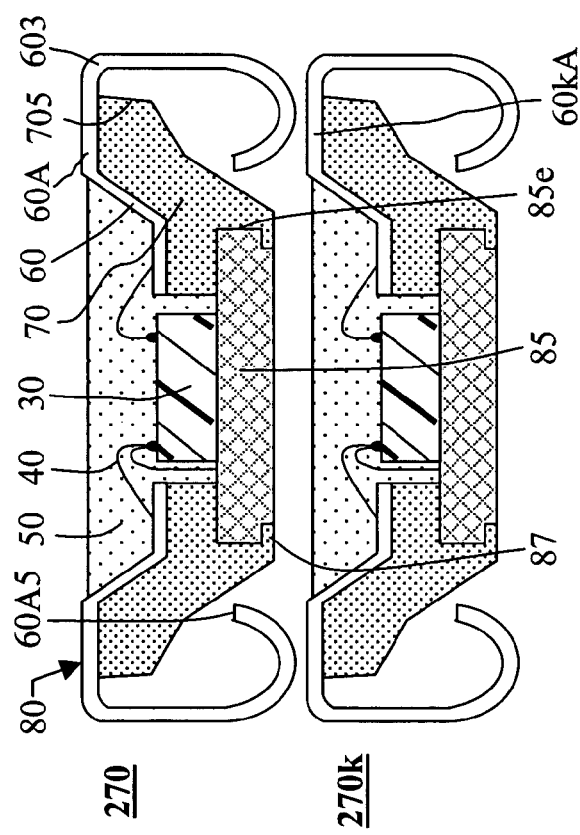

FIG. 29 shows the first portion 60A of conductive element 60 having an extending portion 603 which protrudes the side wall 705 of insulator 70. In this manner, the electrical device 270 enables to electrically connect to another electrical device 270k through the extending portion 603, and the electrical device 270 stacked on the electrical device 270k, and the submember 85 with the side edge 85e and the recessed portion 87 embedded in the insulator 70.

Figure 30:
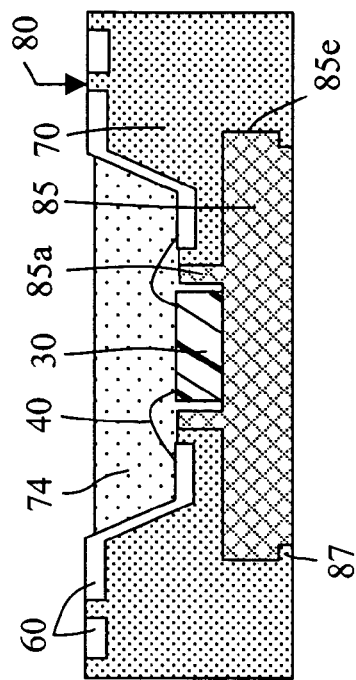
FIGS. 29-35 are cross-sectional views show embodiments of electrical device according to the present invention, the substrate is manufactured by the third method of second preferred embodiment of substrate.

FIG. 30 shows the submember 85 having a portion 85a which is for preventing the insulator 70 from overflowing into the recess 74 while operating the filling process of insulator 70.

Figure 31:
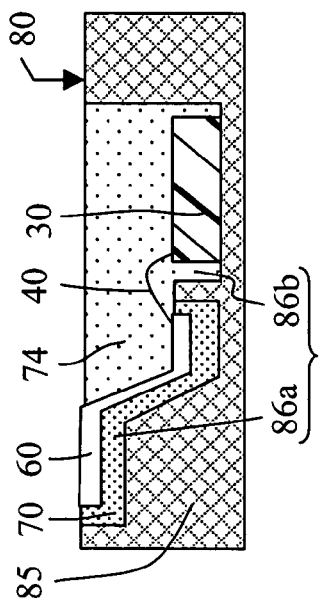

FIG. 31 shows the insulator 70 and the conductive element 60 placed in the first portion 86a of recess 86 of submember 85, wherein the recess 86 of submember 85 serving as a portion of the recess 74 of insulator 70 of substrate 80.

Figure 32:
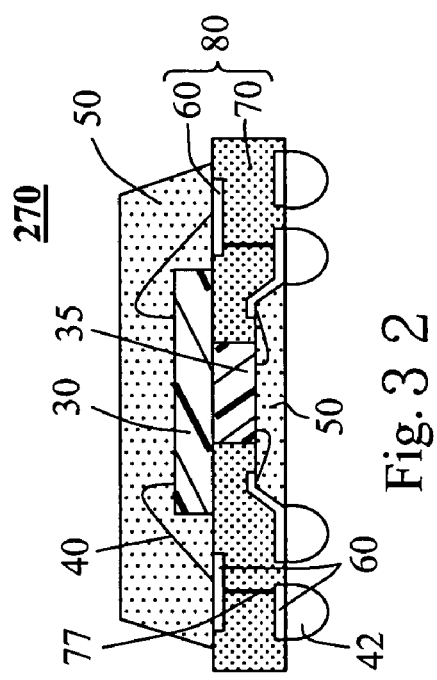

FIG. 32 shows the substrate 80 having a plurality of via 77 which are between the upper surface of insulator 70 and the lower surface of insulator 70, wherein the via 77 electrically connected the conductive elements 60 on the upper surface of insulator 70 to the conductive elements 60 on the lower surface of insulator 70, and a plurality of solder balls 42 attached to the conductive elements 60 for electrical connection.

Figure 33:
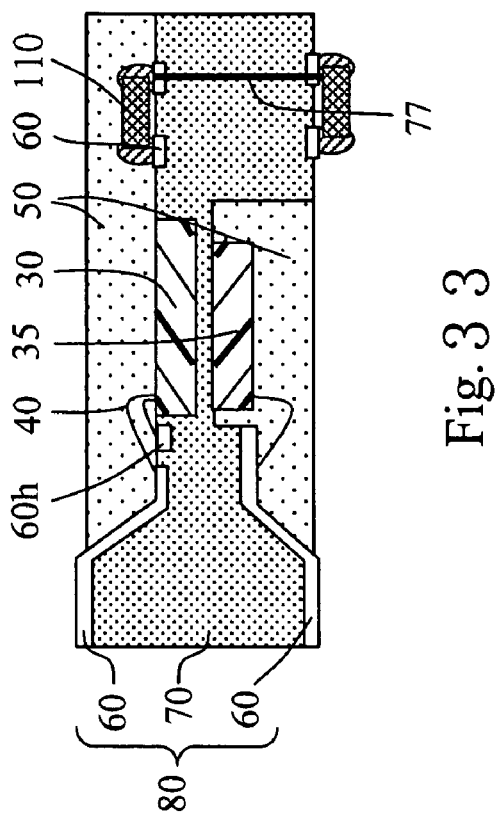
Figure 34:
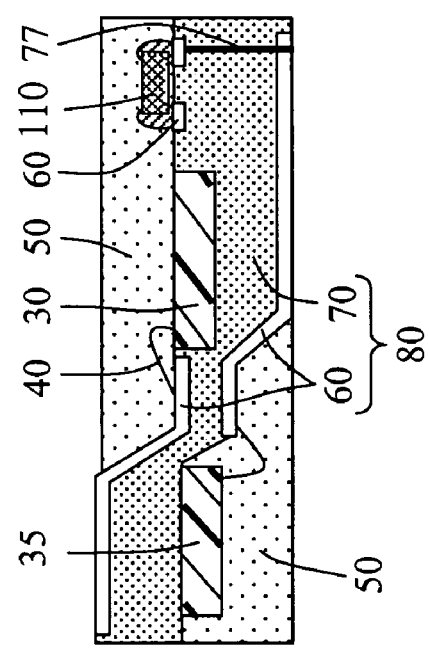

FIG. 33-34 show the conductive elements 60 which embedded in the upper surface and the lower surface of insulator 70 are exposed to the insulator 70 for electrical connection; wherein FIG. 33 shows the conductive element 60 having an electrical ring 60h which is next to the chip 30, the electrical ring 60h is for power supply, signal transfers, and/or electromagnetic interference prevention.

Figure 35:
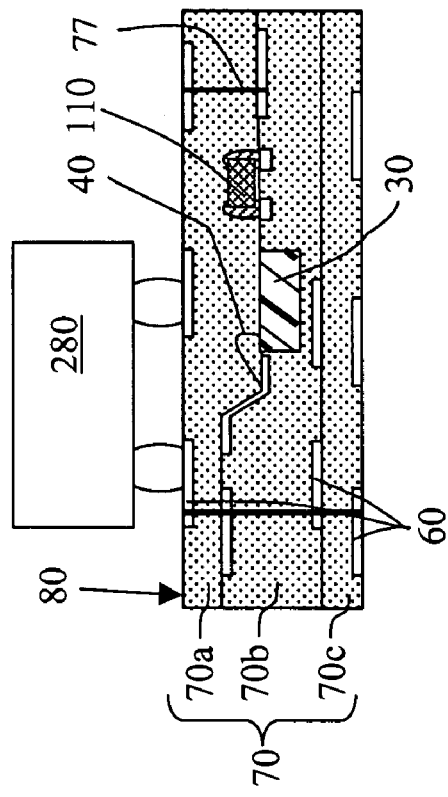

FIG. 35 shows the insulator 70 having a first portion 70a, a second portion 70b and a third portion 70c, wherein after the second portion 70b formed, and both the conductive wires 40 and the component 110 been positioned too, then the first portion 70a and the third portion 70c coupled with the second portion 70b respectively, wherein when the second portion 70b formed, the chip 30 been positioned too; and the first, second, third portions 70a, 70b, 70c having conductive elements 60 respectively; an electrical device 280 mounted on the substrate 80.

FIGS. 36A-36D shows a step for manufacturing an electrical device, the substrate is manufactured by the third method of second preferred embodiment, wherein when the substrate accomplished, the electrical device also form; At first, a wafer which having a plurality of chips coupled with the adhesive mean, secondly, the wafer encapsulated by the insulator. In this manner, it is not necessary for the substrates to be coupled with the wafer through an adhesive mean which is between the substrate and the wafer, then material saved, cost saved, and the electrical device thickness is thinner. Moreover, before the electrical device formed completely, the chip in electrical device can be tested/checked by the testing probes of tester for identifying a good chip or a bad chip which is in the electrical device. In this manner, the time for testing chip shortened, and the efficiency of tester increased. Detailed descriptions as follow:

FIG. 36A shows a plurality of conductive elements 60 attached to the adhesive mean 55 which sucked onto the die 25B through the vacuum holes 27 by the vacuum supply "K", wherein the adhesive mean 55 having a plurality of protruding portions 55j and openings 55c, the die 25B still having a plurality of through holes 29 which are corresponding to the openings 55c respectively; Providing a wafer 350 which having a plurality of chips 30, the wafer 350 (the active surfaces 31 of chips 30) coupled with the protruding portions 55j of adhesive mean 55; wherein the wafer 350 may be coupled with the third portions 60C of conductive element 60 by an adhesive mean (refer to the detailed descriptions of FIG. 43A-FIG. 43E) as required; a dam 355 between the wafer 350 and the adhesive mean 55 is for preventing the insulator 70 from overflowing to outside of wafer 350, wherein the dam 355 is optional;

FIG. 36B-1 shows By means of the through holes 29 and the openings 55c, filling the insulator 70 into the space between the adhesive mean 55 and the wafer 350, then the insulator 70 encapsulates the adhesive mean 55, conductive elements 60 and the wafer 350, in this manner, the substrate 80 formed, and the insulator 70 has already been coupled with the wafer 350; wherein the process of filling the insulator 70 into the space between the adhesive mean 55 and the wafer 350 may be operating as shown in FIG. 36B-2 which shows After the wafer 350 coupled with the protruding portions 55j of adhesive mean 55, then removed the die 25B, after that, filling the insulator 70 into the space between the adhesive mean 55 and the wafer 350 through the openings 55c of adhesive mean 55, in this manner, the substrate 80 formed, and the insulator 70 has already been coupled with the wafer 350 (due to the insulator 70 encapsulates the conductive elements 60 and the wafer 350 simultaneously);

FIG. 36C shows the encapsulation process of encapsulant 50 accomplished, then providing the testing probes "P" for testing each chip 30 and checking if the chip 30 is good or not;

FIG. 36D shows providing a blade "B" for sawing the substrate 80 and the wafer 350, then the electrical device 270 formed, wherein the insulator 70 of substrate 80 encapsulates the conductive elements 60 and the chip 30 respectively (i.e. it is not necessary for the insulator 70 of substrate 80 to be coupled with the chip 30 through an adhesive mean which is between the insulator 70 of substrate 80 and the chip 30); In this manner, not only materials saved, but the electrical device 270 thickness is thinner. It is good for the industry of electronics. Wherein the wafer 350 may be divided into a plurality of chips 30 firstly, then each individual chip 30 enables to be coupled with each corresponding protruding portions 55j as required, in this manner, the plural chips 30 may be instead of the wafer 350.

Figure 37:
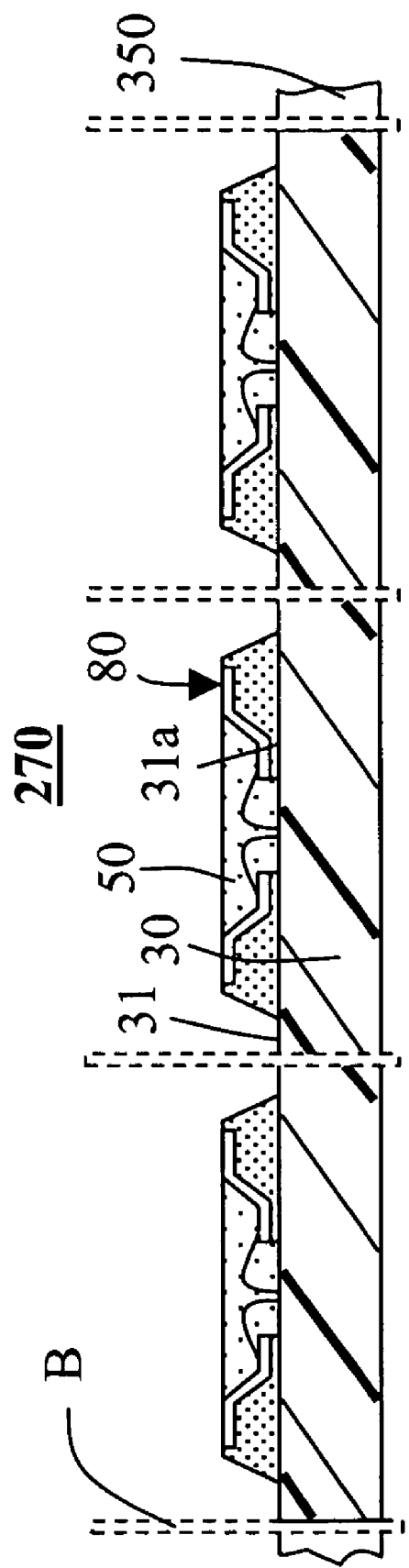
FIG. 37 shows a cross-sectional view of a final step for manufacturing an electrical device according to the present invention, the substrate is manufactured by the third method of second preferred embodiment of substrate.

FIG. 37 shows a final process of manufacturing an electrical device, the substrate is manufactured by the third method of second preferred embodiment, wherein the substrate 80 is upon the central area 31a of active surface 31 of chip 30. In this manner, the blade "B" sawing the wafer 350 exclusively, then the electrical device 270 formed.

Figure 38A:
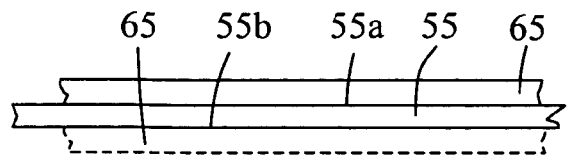
FIGS. 38A-38D show cross-sectional views of a step of fourth method for manufacturing a second preferred embodiment of substrate of the present invention, wherein FIG. 38Ca is a side view of FIG. 38C.
Figure 38B:
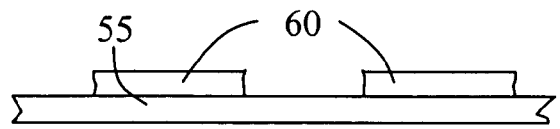
Figure 38C:
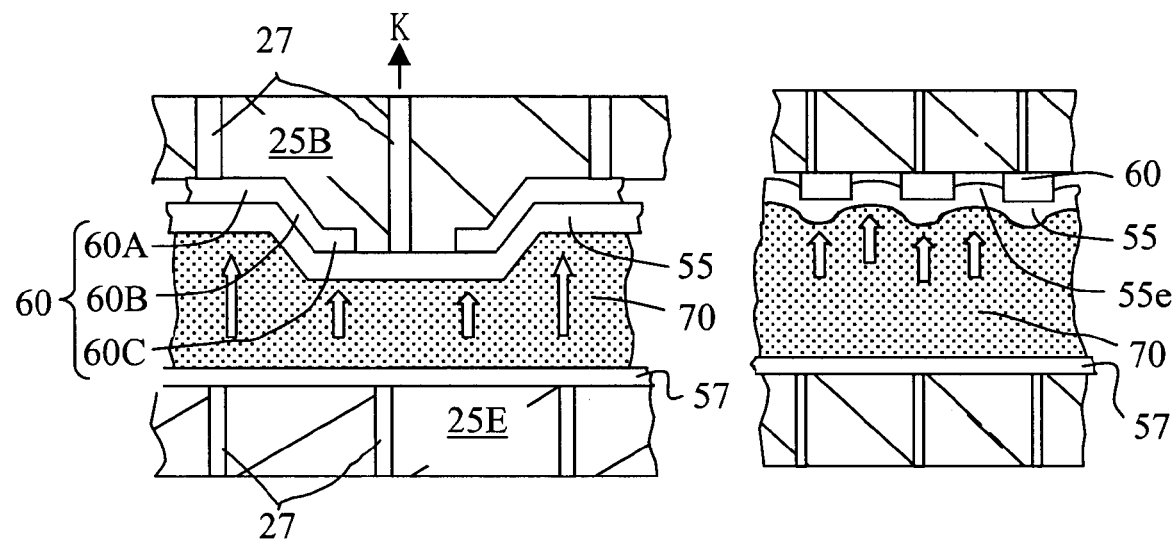
Figure 38D:
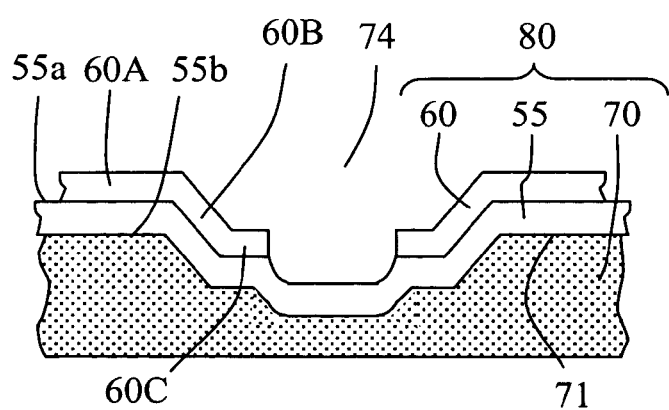

Further another embodiment of the present invention will be explained with reference to FIGS. 38A-38D, which is the fourth method for manufacturing the second embodiment of substrate of the present invention, wherein the substrate having an adhesive mean which serving as an insulative layer, the adhesive mean is between the conductive elements and the insulator. In this manner, the solder balls are not needed. Moreover, the substrate of the present invention may further comprise a submember (refer to FIG. 39) for enhancing heat dissipation. Detailed descriptions as follow:

FIG. 38A shows providing a conductive plate 65 which is attached to the upper surface 55a of adhesive mean 55, wherein another conductive plate 65 (the dotted one) may be attached to the lower surface 55b of adhesive mean 55 as required, FIG. 38B shows After etching process, a plurality of conductive elements 60 formed by the conductive plate 65;

FIGS. 38C, 38Ca (FIG. 38Ca is a side view of FIG. 38C) show the pressurized-liquid insulator 70 squeezes the adhesive mean 55 and the conductive elements 60, so that the conductive elements 60 become staircase-shaped according to the die 25B surface, meanwhile, due to the adhesive mean 55 squeezed by the insulator 70, a plurality of protruding portions 55e of adhesive mean 55 formed, wherein the protruding portions 55e of adhesive mean 55 are between the conductive elements 60 and the other conductive elements 60 respectively, in this manner, the insulator 70 surface contacted with the adhesive mean 55 increased, then the insulator 70 encapsulates the adhesive mean 55 more securely; In addition, the process of filling insulator 70 may be accomplished by a screen printing process as required;

FIG. 38D shows the substrate 80 formed after the insulator 70 becomes a solid state, the substrate 80 comprising: an insulator 70 having a recess 74; an adhesive mean 55 having a plurality of protruding portions 55e which are between the conductive elements 60 and the others respectively, wherein the lower surface 55b encapsulated by the insulator 70; and a plurality of conductive elements 60 which are staircase-shaped and mounted on the upper surface 55a of adhesive mean 55, in this manner, the adhesive mean 55 is between the conductive elements 60 and the insulator 70, wherein the conductive elements 60 extending from the upper surface 55a of adhesive mean 55 to the recess 74 of substrate 80, wherein the first portion 60A is upon the upper surface 55a of adhesive mean 55 for electrical connection; the third portion 60C is upon the upper surface 55a of adhesive mean 55 for electrical connection; the third portion 60C is within the recess 74 of substrate 80, the second portion 60B is between the first portion 60A and the third portion 60C; Due to the conductive elements 60 mounted on the adhesive mean 55, it is not necessary for the conductive elements 60 to electrically connect to outside through solder balls, then material and cost saved, and the substrate 80 thickness is thinner.

FIGS. 39-42 show embodiments of electrical device according to the present invention, the substrate of electrical device is manufactured by the fourth method of second preferred embodiment of substrate related to this invention.

Figure 39:
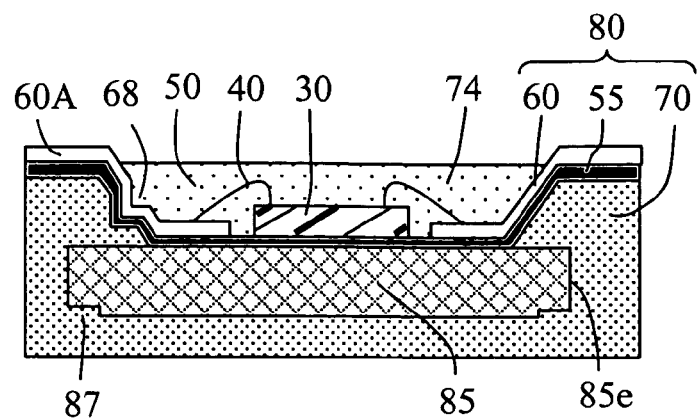
FIGS. 39-42 are cross-sectional views show embodiments of electrical device according to the present invention, the substrate is manufactured by the fourth method of second preferred embodiment of substrate.

FIG. 39 shows a submember 85 such as a heat spreader embedded in the insulator 70 and coupled with the adhesive mean 55. In this manner, the submember 85 is below the recess 74, wherein the adhesive mean 55 do not have the protruding portions 55e (see FIG. 38Ca); Moreover, the first portion 60A of conductive element 60 may have an extending portion (refer to "603" in FIG. 29) for electrically connecting to outside as required; In addition, the submember 85 may not touch the adhesive mean 55 but may be still below the recess 74 as required.

Figure 40:
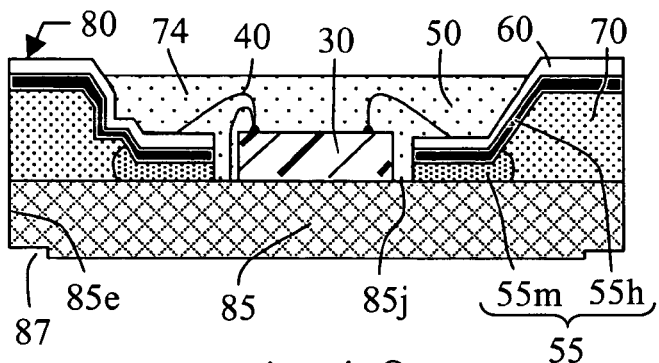

FIG. 40 shows the adhesive mean 55 having a first portion 55h and a second portion 55m, the first portion 55h serving as adhesive tape, and the second portion 55m serving as glue; The submember 85 coupled with the second portion 55m of adhesive mean 55 and been below the recess 74, wherein a portion 85j of submember 85 exposed to the adhesive mean 55; The submember 85 and the adhesive mean 55 are encapsulated by the insulator 70 respectively, however, both the side edge 85e and the recessed portion 87 are not encapsulated by the insulator 70 but exposed to the insulator 70.

Figure 41:
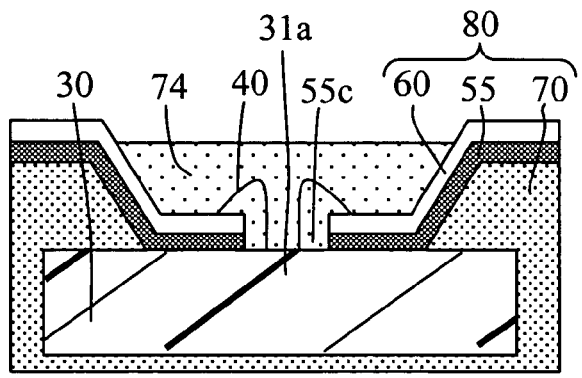

FIG. 41 shows the central area 31a of chip 30 exposed to the adhesive mean 55, a plurality of conductive wires 40 passing through the opening 55c of adhesive mean 55, and electrically connected the chip 30 to the conductive elements 60 wherein the opening 55c serving as a portion of the recess 74.

Figure 42:
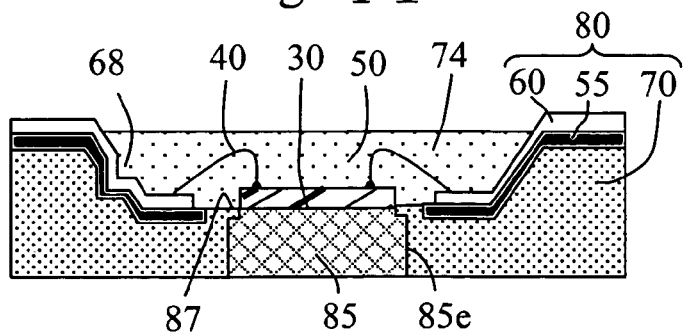

FIG. 42 shows the submember 85 is below the recess 74, meanwhile, the submember 85 does not touch the adhesive mean 55.

Figure 43A:
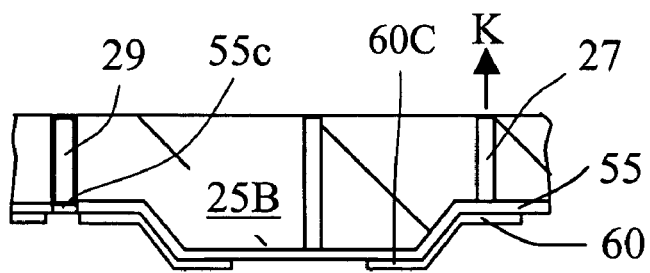
FIGS. 43A-43E show cross-sectional views of a step for manufacturing an electrical device according to the present invention, the substrate is manufactured by the fifth method of second preferred embodiment of substrate.
Figure 43B:
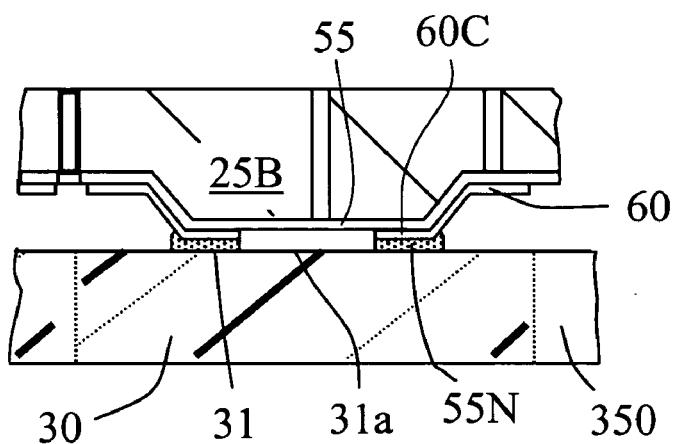
Figure 43C:
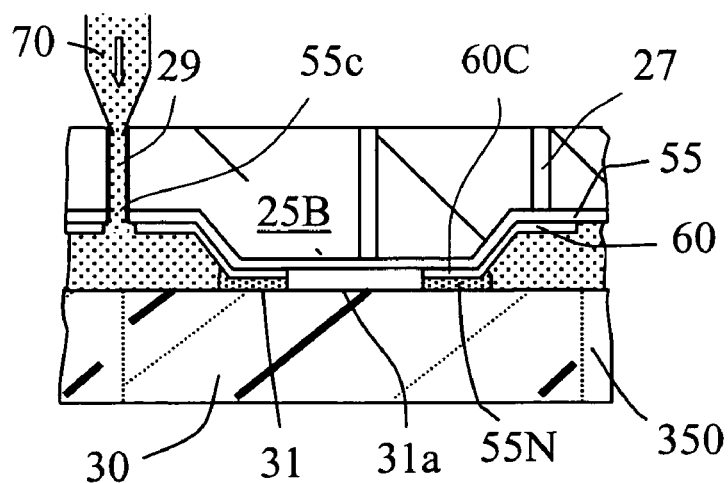
Figure 43D:
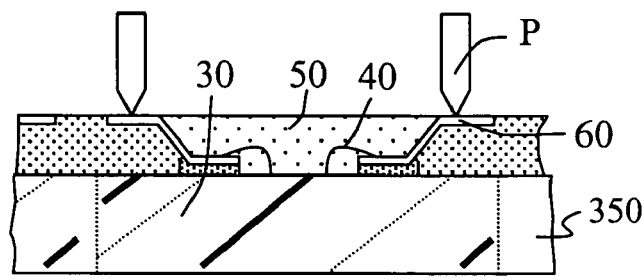
Figure 43E:
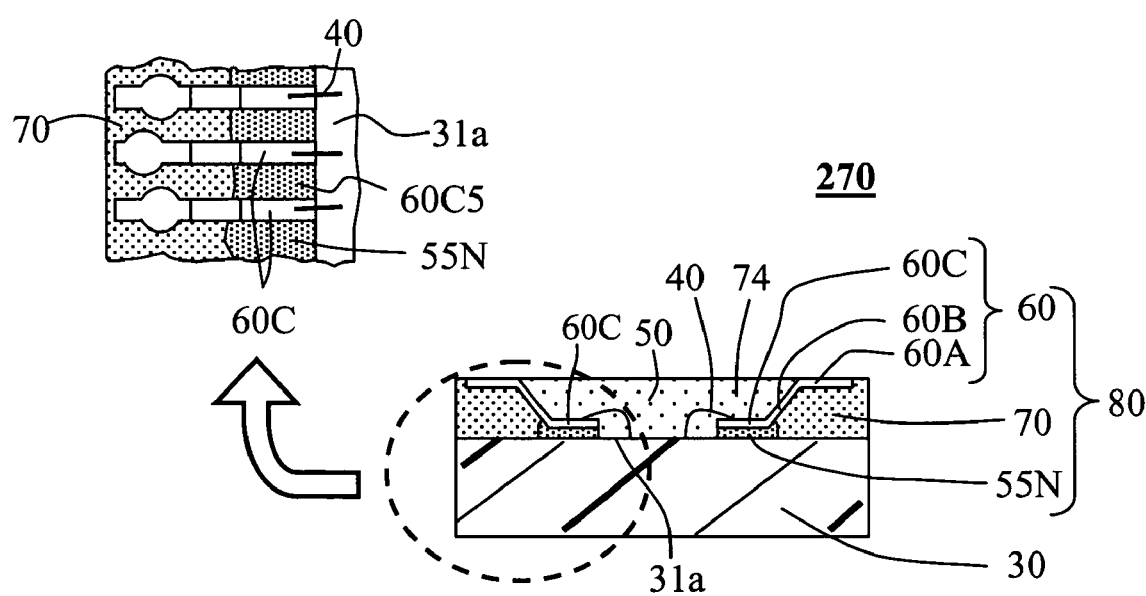
Figure 48:
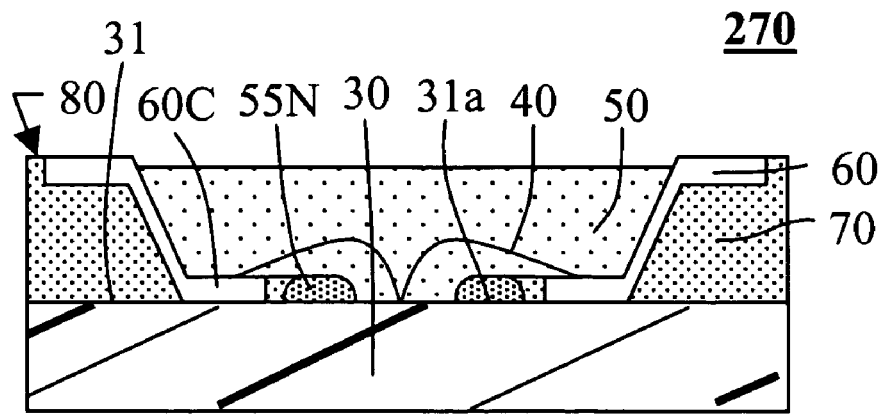

Further another embodiment of the present invention will be explained with reference to FIGS. 43A-43E, which is the fifth method for manufacturing the second embodiment of substrate of the present invention, wherein when the substrate accomplished, the electrical device also formed, wherein the substrate further comprising an adhesive mean such as adhesive tape, glue or the like. At first, a wafer which having a plurality of chips coupled with the third portions of conductive element by means of adhesive means respectively. Secondly, the chips of wafer encapsulated by the insulator. In this manner, the chips of wafer have already been coupled with the substrates respectively, while the filling insulator process accomplished, then it is not necessary for the substrates to be coupled with the chips of wafer through an adhesive mean which is between the insulator of substrate and the chip, then material saved, cost saved, and the electrical device thickness is thinner. Moreover, before the electrical device formed completely, the chip in electrical device can be tested by the testing probes of tester for identifying a good chip or a bad chip. In this manner, the time for testing the chip in the electrical device shortened, and the efficiency of tester increased. Detailed descriptions as follow:

FIG. 43A shows the conductive elements 60 attached to the adhesive mean 55 which is sucked onto the die 25B through the vacuum holes 27 by means of vacuum supply "K", wherein the adhesive mean 55 is optional, when the adhesive mean 55 is omitted, the conductive elements 60 may be directly sucked onto the die 25B through the vacuum holes 27 by means of vacuum supply "K" as required;

FIG. 43B shows the active surface 31 of chip 30 having a central area 31a, and the active surface 31 of chip 30 coupled with the third portion 60C of conductive element 60 by an adhesive mean 55N which also coupled with the adhesive mean 55, then the third portion 60C embedded in the adhesive mean 55N (the advantages of adhesive mean 55N, refer to the detailed descriptions for the adhesive mean 55N in FIG. 43E) moreover, the active surface 31 of chip 30 may be coupled with the adhesive mean 55 by adhesive mean 55N exclusively (refer to "55N" in FIG. 48, wherein the adhesive mean 55 has been removed already.)

FIG. 43C shows providing the filling process of insulator 70 for encapsulating the adhesive mean 55, protruding portions 66, adhesive mean 55N and wafer 350;

FIG. 43D shows the encapsulation process of encapsulant 50 accomplished, then providing the testing probes "P" for testing each chip 30 and checking if the chip 30 is good or not;

FIG. 43E shows the electrical device 270 formed, wherein the adhesive mean 55N encapsulates the third portions 60C which embedded therein, and the adhesive mean 55N surface contacted with the third portion 60C increased, then the adhesive mean 55N coupled with the third portion 60C more securely, and the reliability of electrical device 270 enhanced; Meanwhile, the gaps 60C5 between the third portions 60C and the others are filled by the adhesive mean 55N, In this manner, the third portions 60C combined with the adhesive mean 55N are serving as a dam for preventing the insulator 70 from touching the central area 31a (refer to FIG. 43C) by means of the gaps 60C5 while operating the filling process of insulator 70, in order to avoid a poor electrical connection which the conductive wires 40 electrically connect to the chip 30. Because the reliability of electrical device 270 may become poor when the poor electrical connection happens; Furthermore, due to the chip 30 coupled with the third portion 60C of conductive element 60 by the adhesive mean 55N (refer to FIG. 43B), the electrical device 270 thickness becomes thinner. It is good for the industry of electronics, wherein the substrate 80 formed and the chip 30 coupled with the substrate 80 simultaneously after the insulator 70 solidified; the substrate 80 comprising an insulator 70 having a recess 74, an adhesive mean 55N, and a plurality of conductive elements 60, each conductive element 60 having a first portion 60A, a second portion 60B, a third portion 60C, and each conductive element 60 is staircase-shaped, the conductive element 60 extending from the insulator 70 surface to the recess 74, wherein the insulator 70 encapsulates the first portion 60A, the second portion 60B which are imbedded therein, the first portion 60A exposed to the insulator 70 for electrical connection; the adhesive mean 55N encapsulates the third portion 60C which embedded therein, the third portion 60C is within the recess 74 and is for electrical connection, wherein the adhesive mean 55N encapsulated by the insulator 70; the second portion 60B is between the first portion 60A and the third portion 60C; Moreover, a molding die may be instead of the wafer 350 for manufacturing the substrate 80 exclusively.

FIGS. 44-49 show embodiments of electrical device according to the present invention, the substrate of electrical device is manufactured by the fifth method of second preferred embodiment of substrate related to this invention.

Figure 44:
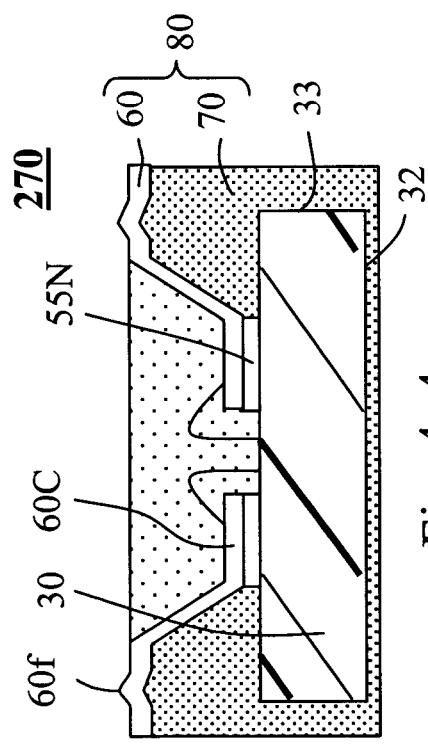

FIG. 44 shows the conductive element 60 having a protruding portion 60f, and then the conductive element 60 is more convenient for electrical connection.

Figure 45:
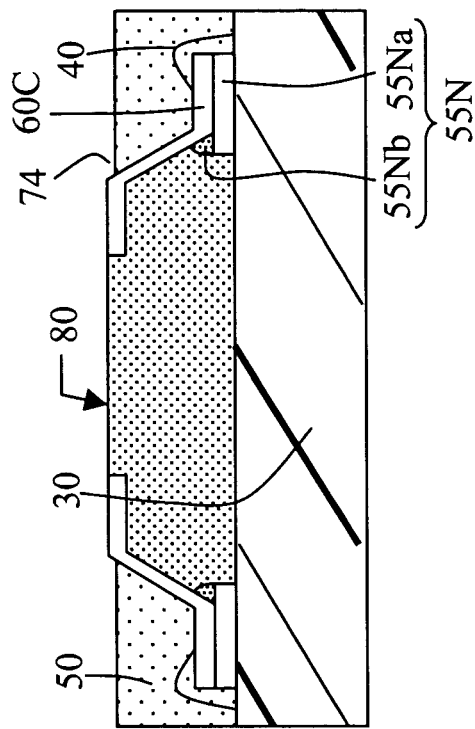
FIGS. 44-49 are cross-sectional views show embodiments of electrical device according to the present invention, the substrate is manufactured by the fifth method of second preferred embodiment of substrate.
Figure 46:
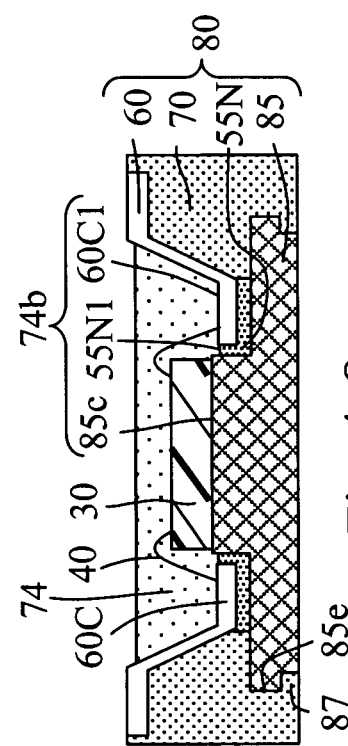

FIG. 45 shows the adhesive mean 55N having a first portion 55Na and a second portion 55Nb, the first portion 55Na serving as adhesive tape, and the second portion 55Nb serving as glue FIG. 46 shows the bottom 74b of recess 74 of substrate 80 consists of the electrical surface 60C1 of third portion 60C, the adhesive mean 55N surface 55N1 and the submember 85 surface 85c, wherein the submember 85 surface 85c exposed to the adhesive mean 55N, and the submember 85 is below the recess 74.

Figure 47:
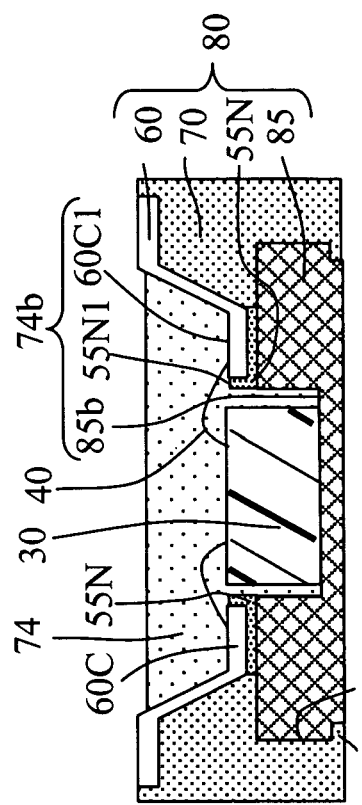

FIG. 47 shows the bottom 74b of recess 74 of substrate 80 consists of the electrical surface 60C1 of third portion 60C, the adhesive mean 55N surface 55N1 and the submember 85 surface 85b, wherein the submember 85 surface 85b exposed to the adhesive mean 55N, and the submember 85 is below the recess 74.

FIG. 48 shows the central area 31a of chip 30 coupled with the adhesive mean 55N which encapsulated by the insulator 70, however, the adhesive mean 55N does not touch the third portion 60C of conductive element 60 of substrate 80. Moreover, the substrate 80 may be formed firstly, then the active surface 31 of chip 30 may be coupled with the substrate 80 through an adhesive mean (not shown) later.

Figure 49:
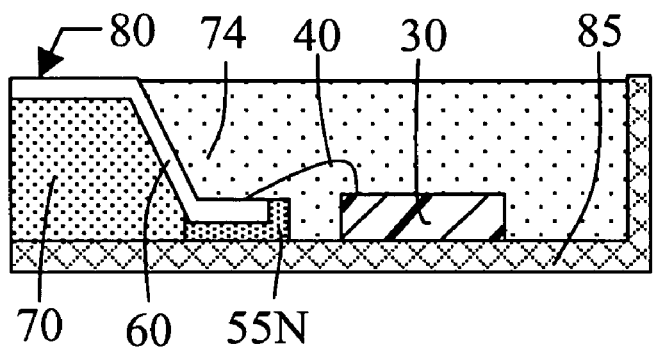

FIG. 49 shows a submember 85 coupled with the adhesive mean 55N and the insulator 70 (i.e. the submember 85 encapsulated by the adhesive mean 55N and the insulator 70). In this manner, it is not necessary for the submember 85 to be coupled with the substrate 80 through an adhesive mean which is between the submember 85 and the substrate 80.

Figure 50:
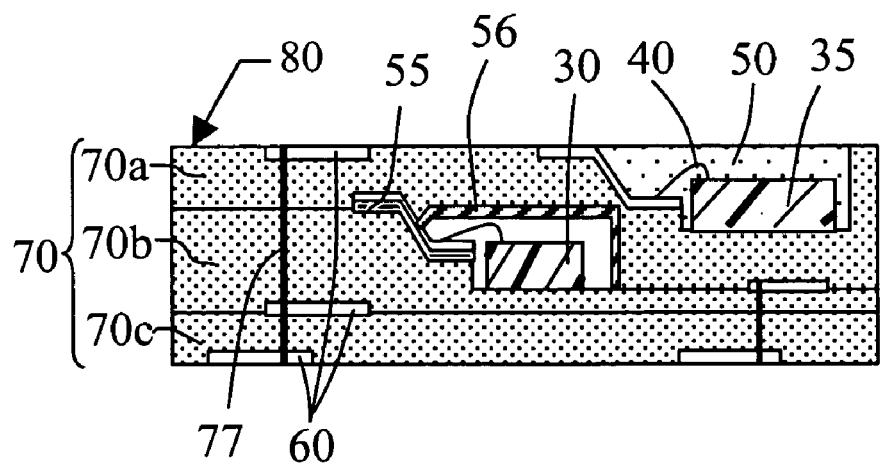
FIG. 50 is a cross-sectional view shows an embodiment of electrical device according to the present invention, the substrate is manufactured by the third and fourth methods of second preferred embodiment of substrate.
Figure 51:
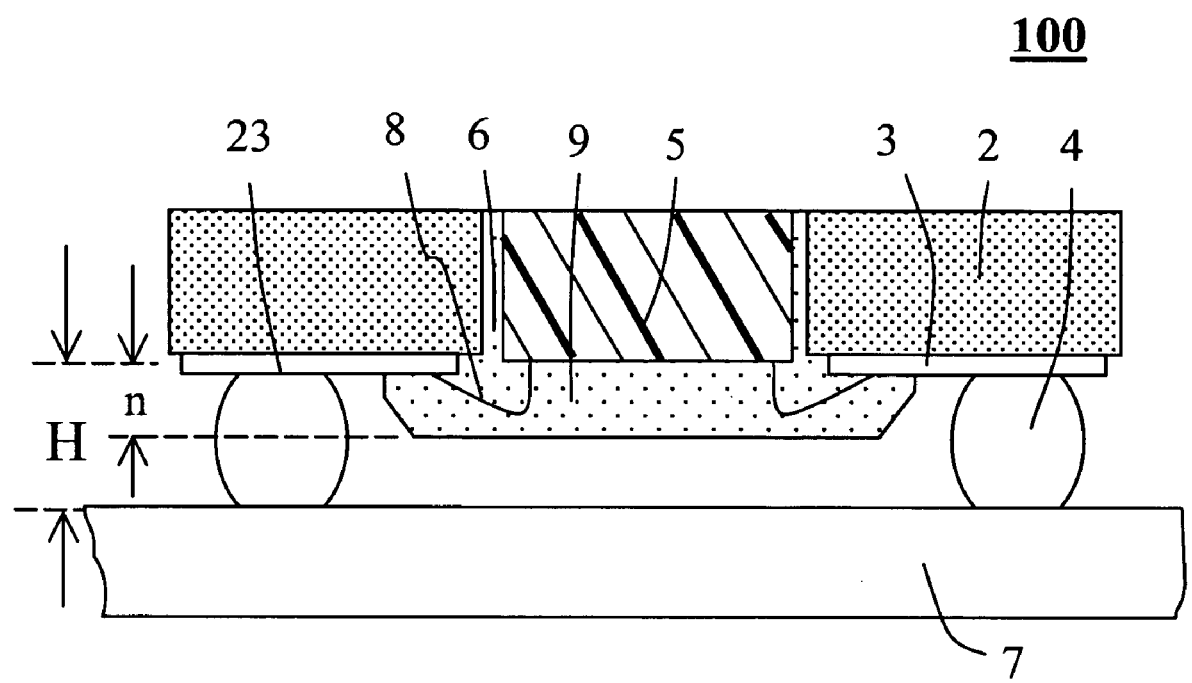
FIG. 51 shows a cross-sectional view of electrical device according to a prior art.

In accordance with the mentioned-above descriptions accompanying drawings, this invention has been described in terms of several preferred embodiments, various alterations and modifications can be made to become apparent to those skilled in the art. For example, FIG. 50 shows the substrate 80 manufactured by both the third method and the fourth method of second preferred embodiments, wherein the second portion 70b manufactured by the fourth method of second preferred embodiment firstly, the first, third portions 70a, 70c manufactured by the third method of second preferred embodiment later. After the chip 30 covered with the lid 56, then the second portion 70b coupled with the first, third portions 70a, 70c respectively; In addition, the conductive element (see "60" in FIG. 44) may have an extending portion (see "603" in FIG. 29) as required, Furthermore, the submember (see "85" in FIG. 46) may not touch the adhesive mean 55N as required.

Accordingly, since many such various alterations can be made to the foregoing descriptions, it is to be understood that the scope of the invention is not limited to the disclosed embodiments but is defined by the appended claims.

What is claimed is:

1. A substrate for electrical device comprising:
an insulator having at least a recess, an upper surface and a corresponding lower surface, wherein the recess of insulator having at least a wall and a bottom, wherein the wall of recess is between the upper surface of insulator and the bottom of recess, and wherein the bottom of recess is corresponding to the lower surface of insulator; and
at least a conductive element having a first portion, a second portion and a third portion, the conductive element is staircase-shaped, the conductive element further having an electrical surface which consists of the electrical surface of first portion, the electrical surface of second portion and the electrical surface of third portion, the electrical surface of conductive element is for electrical connection; the conductive element embedded in the insulator, and the conductive element extending from the upper surface of insulator along the wall of recess to the bottom of recess, wherein the electrical surface of first portion of conductive element protruded and exposed to the upper surface of insulator entirely; the electrical surface of third portion is within the recess and exposed to the insulator for electrical connection; the second portion is between the first portion and the third portion.

2. The substrate of claim 1, wherein the recess of substrate having at least an opening.

3. The substrate of claim 2, further comprising a chip which is including an active surface, said active surface of said chip coupled with said substrate, wherein said chip is not within the recess of the insulator; said chip electrically connected to said substrate through at least a conductive mean which is selectively serving as a conductive wire or a conductive bump.

4. The substrate of claim 2, wherein at least a conductive wire going through the opening of the recess.

5. The substrate of claim 1, further comprising a submember which is below the recess of substrate and at least a portion of the submember encapsulated by the insulator, wherein the submember selectively serving as a heat spreader, a chip or a transparent plate.

6. The substrate of claim 5, wherein a portion of the submember is exposed to the bottom of recess of insulator.

7. The substrate of claim 5, wherein the submember is not exposed to the bottom of recess of insulator.

8. The substrate of claim 1, further comprising a chip which is coupled with the substrate, wherein, the chip electrically connected to the substrate through at least a conductive mean.

9. The substrate of claim 8, wherein said chip is placed within said recess of said substrate.

10. The substrate of claim 8, further comprising an encapsulant, said encapsulant seals said substrate, said chip, and said conductive mean.

11. The substrate of claim 1, further comprising at least an adhesive mean which encapsulates the third portion of conductive element, in this manner, at least a portion of the third portion of conductive element embedded in the adhesive mean, wherein said adhesive mean encapsulated by said insulator.

12. The substrate of claim 1, further comprising a submember having at least a recess, the submember encapsulated by the insulator, in this manner, at least a portion of third portion of conductive element and at least a portion of insulator are within the recess of submember, wherein the insulator is between the conductive element and the submember, and at least a portion of the recess of submember serving as a portion of the recess of insulator.

13. The substrate of claim 1, wherein the first portion of conductive element having a side edge which is exposed to the side wall of insulator.

14. The substrate of claim 1, wherein the third portion of conductive element having a second surface which is corresponding to the electrical surface of third portion of conductive element and is exposed to the insulator.

15. The substrate of claim 1, wherein the electrical surface of second portion of conductive element encapsulated by the insulator, in this manner, the shape of conductive element is discontinuous in accordance with the insulator surface.

16. The substrate of claim 1, wherein the third portion of conductive element having a second surface which is corresponding to the electrical surface of third portion of conductive element and being encapsulated by the insulator, in this manner, said second surface of third portion of conductive element is not exposed to the insulator.

* * * * *